(12) United States Patent
Kim et al.

(10) Patent No.: US 7,633,573 B2
(45) Date of Patent: Dec. 15, 2009

(54) LIQUID CRYSTAL DISPLAY DEVICE AND METHOD OF FABRICATING THE SAME

(75) Inventors: Young-Joo Kim, Gyeonggi-Do (KR); Seok-Woo Lee, Gyeonggi-Do (KR)

(73) Assignee: LG. Display Co., Ltd., Seoul (KR)

( * ) Notice: Subject to any disclaimer, the term of this patent is extended or adjusted under 35 U.S.C. 154(b) by 475 days.

(21) Appl. No.: 11/586,831

(22) Filed: Oct. 26, 2006

(65) Prior Publication Data
US 2008/0002081 A1 Jan. 3, 2008

(30) Foreign Application Priority Data
Jun. 30, 2006 (KR) .................. 10-2006-0061665

(51) Int. Cl.
*G02F 1/136* (2006.01)
(52) U.S. Cl. ........................... 349/43; 349/42
(58) Field of Classification Search ........................ None
See application file for complete search history.

(56) References Cited

U.S. PATENT DOCUMENTS

| 7,164,408 B2 * | 1/2007 | Murade ................. 345/100 |
| 7,330,234 B2 * | 2/2008 | Murakami et al. ......... 349/155 |
| 2008/0174710 A1 * | 7/2008 | Murakami et al. .......... 349/43 |

* cited by examiner

*Primary Examiner*—Sung H Pak
(74) *Attorney, Agent, or Firm*—Brinks Hofer Gilson & Lione

(57) ABSTRACT

An LCD device and a method of fabricating the same are provided. The LCD device comprises a first substrate divided into a pixel unit and a circuit unit. Active patterns are disposed in the pixel unit and the circuit unit of the first substrate. A first insulating film is disposed on the first substrate. Gate electrodes are disposed in the pixel unit and the circuit unit of the first substrate, and common lines are disposed in the pixel unit of the first substrate. First contact holes and second contact holes are disposed in regions of the first insulating film, the first interlayer insulating film and the second interlayer insulating film. Source electrodes and drain electrodes electrically connect to the source regions and the drain regions of the active patterns through the first contact holes and the second contact holes.

33 Claims, 24 Drawing Sheets

LIQUID CRYSTAL DISPLAY DEVICE AND METHOD OF FABRICATING THE SAME

This patent document claims the benefit of Korean Patent Application 2006-61665 filed on Jun. 30, 2006, which is hereby incorporated by reference.

BACKGROUND

1. Field

The present embodiments relate to a liquid crystal display (LCD) device and a method of fabricating the same.

2. Related Art

A display device can be used as a visual information transfer medium. It is desired that a display device has lower power consumption, a thin thickness, a light weight and high image quality. An LCD device, which is a flat panel display (FPD) device, satisfies the aforementioned characteristics and is easily mass-produced. A variety of new products using the LCD device have been developed. The LCD device has become a core component which has gradually replaced a general cathode ray tube (CRT).

In general, the LCD device can display images by controlling optical transmissivity of liquid crystal cells aligned in a matrix shape. The LCD device individually supplies data signals to the liquid crystal cells according to image information.

An active matrix (AM) method, which is a driving method commonly used in the LCD device, drives liquid crystals of a pixel unit using amorphous silicon thin film transistors (a-Si TFT) as switching elements. Accordingly, a low-priced insulating substrate can be employed because a low temperature process can be performed on the a-Si TFT. The a-Si TFT has been used more frequently.

However, electric mobility (~1 $cm^2$/Vsec) of the a-Si TFT is not desired for a peripheral circuit requiring a high speed operation over 1 MHz. Therefore, researches have integrated a pixel unit and a driving circuit unit on a glass substrate at the same time by using a polycrystalline silicon (poly-Si) TFT having higher field effect mobility than the a-Si TFT. Accordingly, a driving circuit can be installed directly on a substrate because the poly-Si TFT has low photographic sensitivity and high field effect mobility.

By increasing the mobility, an operating frequency of the driving circuit unit that determines a number of driving pixels is improved. Accordingly, the display device has high minuteness. A charging time of a signal voltage in the pixel unit is reduced to prevent distortion of transferred signals. Thus, quality of the image is improved.

FIG. 1 is a schematic plane view illustrating the structure of a related art LCD device. FIG. 1 illustrates a driving circuit-integrated LCD device which integrates a driving circuit unit on an array substrate. The LCD device includes a color filter substrate 5, an array substrate 10, and a liquid crystal layer (not shown) formed between the color filter substrate 5 and the array substrate 10.

The array substrate 10 includes a pixel unit 35 which is an image display region in which unit pixels are arranged in a matrix shape. A driving circuit unit 30 is positioned outside the pixel unit 35 and includes a data driving circuit unit 31 and a gate driving circuit unit 32.

Although not illustrated, the pixel unit 35 of the array substrate 10 includes a plurality of gate lines and data lines arranged on the array substrate 10 in the horizontal and vertical directions that define a plurality of pixel regions, TFTs that are switching elements formed in the crossing regions of the gate lines and the data lines, and pixel electrodes formed in the pixel regions.

The TFTs are switching elements that apply a signal voltage to the pixel electrodes and intercept the signal voltage. The TFTs are field effect transistors (FET) that control current flows by an electric field.

The driving circuit unit 30 of the array substrate 10 is positioned outside the pixel unit 35, for example, in the region of the array substrate 10 that extends outside the color filter substrate 5. The data driving circuit unit 31 is positioned at one side of the protruded array substrate 10, for example, the long side of the protruded array substrate as shown in FIG. 1. The gate driving circuit unit 32 is positioned at another side of the protruded array substrate 10, for example, the short side of the protruded array substrate 10 as shown in FIG. 1.

The data driving circuit unit 31 and gate driving circuit unit 32 include CMOS structured TFTs, which are inverters that output the input signals. For example, the CMOS is a kind of integrated circuit having a MOS structure which is used in the driving circuit unit TFT requiring high speed signal processing. The CMOS needs an n channel TFT and a p channel TFT and has an intermediate speed and density between NMOS and PMOS.

The gate driving circuit unit 32 and the data driving circuit unit 31 supply scan signals and data signals to the pixel electrodes through the gate lines and the data lines, respectively. The gate driving circuit unit 32 and the data driving circuit unit 31 are connected to an external signal input terminal (not shown) to control external signals from the external signal input terminal and output the resultant signals to the pixel electrodes.

Color filters (not shown) that embody colors and common electrodes (not shown) that face the pixel electrodes formed on the array substrate 10 are formed in the pixel unit 35 of the color filter substrate 5.

A cell gap is maintained by spacers (not shown) so that the color filter substrate 5 and the array substrate 10 can be isolated from each other. The color filter substrate 5 and the array substrate 10 are attached to each other by seal patterns (not shown) formed at the outer portions of the pixel unit 35, thereby forming a unit LCD panel. The color filter substrate 5 and the array substrate 10 are attached to each other through absorption keys.

The driving circuit-integrated LCD device using the poly-Si TFTs has excellent device properties, for example, high image quality, small size and low power consumption.

In the driving circuit-integrated LCD device, the pixel unit TFTs and the circuit unit TFTs must be formed on the same substrate. Generally, both the n channel TFTs and the p channel TFTs must be formed in the circuit unit. As compared with the a-Si TFT LCD device forming single type channels, the driving circuit-integrated LCD device complicates the production process.

A photolithography process is performed to fabricate the array substrate including the TFTs. The photolithography process forms target patterns by transferring patterns formed on a mask to a thin film-deposited substrate. The photolithography process includes a plurality of processes, for example, coating of photosensitive solution, exposure and development. As a result, the plurality of photolithography processes decrease the production yield and increase a probability of generating defects on the TFTs.

The mask that forms the patterns is very expensive. If the number of the masks increases, the production cost of the LCD device increases.

SUMMARY

The present invention is defined by the following claims, and nothing in this section should be taken as a limitation on those claims. The present embodiments are directed to a liquid crystal display device and method of fabricating the same, which may obviate one or more of the problems due to the limitations and disadvantages of the related art.

According to one embodiment, a method of fabricating an LCD device includes the steps of: providing a first substrate divided into a pixel unit and a circuit unit; forming active patterns in the pixel unit and the circuit unit; forming a first insulating film on the first substrate; forming gate electrodes in the pixel unit and the circuit unit, and forming common lines in the pixel unit; forming p+ source/drain regions in predetermined regions of the active patterns; forming a first interlayer insulating film and a second interlayer insulating film on the first substrate; forming first contact holes and second contact holes exposing the source regions and the drain regions of the active patterns by partially removing the first insulating film, the first interlayer insulating film and the second interlayer insulating film; forming source electrodes and drain electrodes electrically connected to the source regions and the drain regions of the active patterns through the first contact holes and the second contact holes, respectively, and forming pixel electrodes connected to the drain electrodes; providing a second substrate; forming a liquid crystal layer on any one of the first and second substrates; and attaching the first and second substrates.

In another embodiment, an LCD device includes a first substrate divided into a pixel unit and a circuit unit. Active patterns are formed in the pixel unit and the circuit unit of the first substrate. A first insulating film is formed on the first substrate. Gate electrodes are formed in the pixel unit and the circuit unit of the first substrate. Common lines are formed in the pixel unit of the first substrate. P+ source/drain regions are formed in predetermined regions of the active patterns. A first interlayer insulating film and a second interlayer insulating film are formed on the first substrate. First contact holes and second contact holes are formed in predetermined regions of the first insulating film, the first interlayer insulating film and the second interlayer insulating film, for exposing the source regions and the drain regions of the active patterns. Source electrodes and drain electrodes electrically connect to the source regions and the drain regions of the active patterns through the first contact holes and the second contact holes, respectively. Pixel electrodes connect to the drain electrodes. A second substrate attached to the first substrate to face the first substrate. A liquid crystal layer formed between the first substrate and the second substrate.

Exemplary embodiments will now be described with reference to the attached drawings.

DETAILED DESCRIPTION

Figure 1:
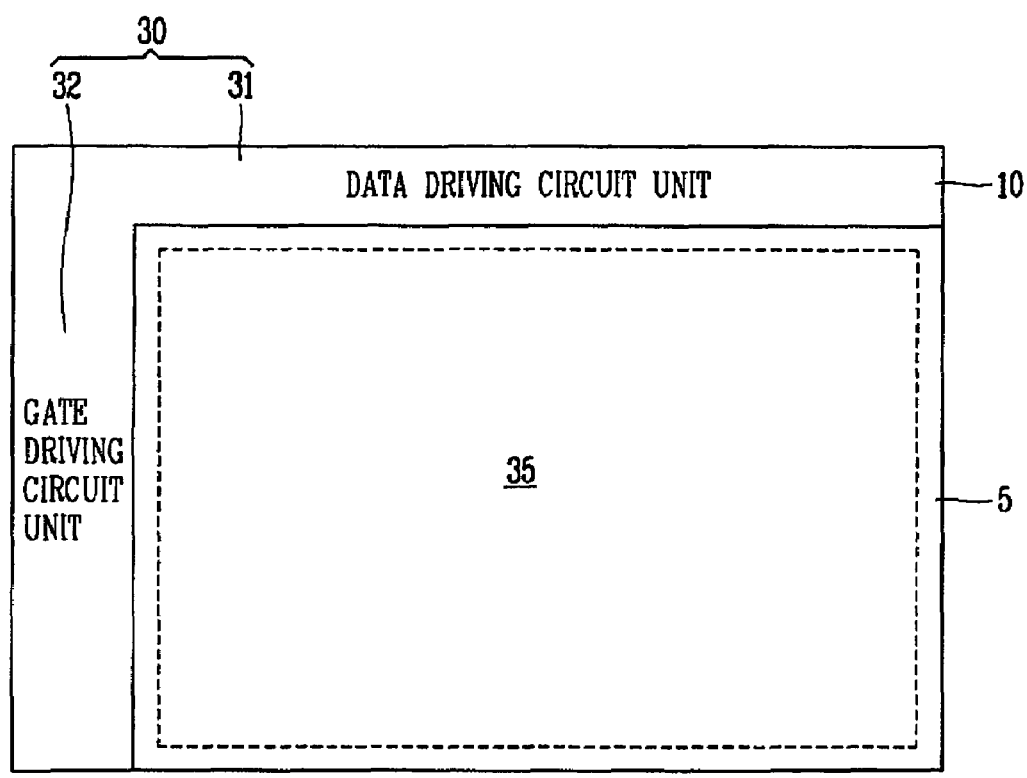
FIG. 1 is a schematic plane view that illustrates a driving circuit-integrated LCD device according to the related art.
Figure 2:
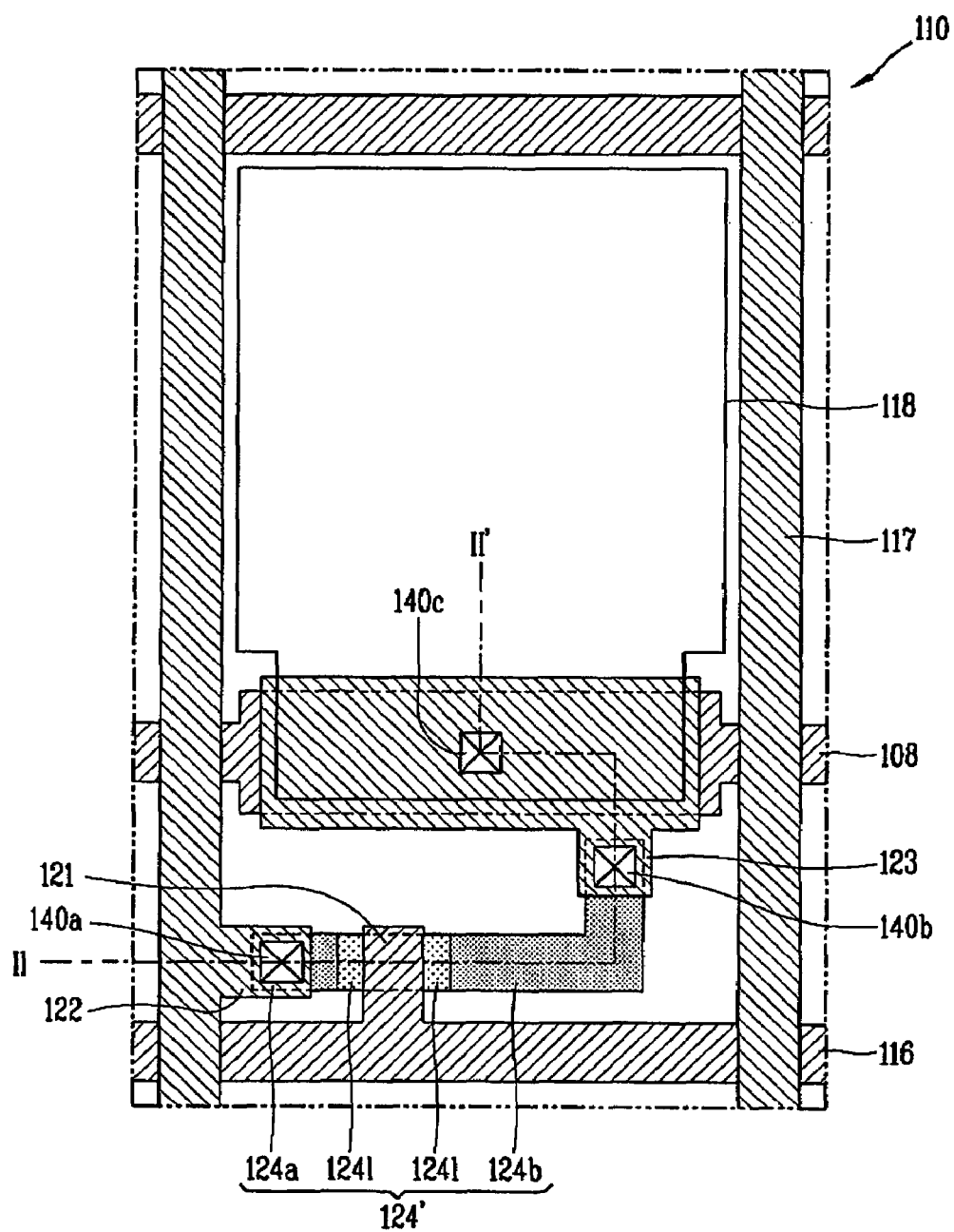
FIG. 2 is a schematic plane view that illustrates part of an array substrate of an LCD device in accordance with an exemplary embodiment.

FIG. 2 is a schematic plane view illustrating part of an array substrate of an LCD device in accordance with an exemplary embodiment.

In accordance with this embodiment, as illustrated in FIG. 2, gate lines 116 and data lines 117 are arranged in the horizontal and vertical directions for defining a pixel region and are formed on the array substrate 110. A TFT that is a switching element is formed in the crossing region of the gate line 116 and the data line 117. A pixel electrode 118 is connected to the TFT for driving liquid crystals (not shown) with a common electrode of a color filter substrate (not shown). The pixel electrode 118 is formed in the pixel region.

The TFT includes a gate electrode 121 connected to the gate line 116, a source electrode 122 connected to the data line 117, and a drain electrode 123 connected to the pixel electrode 118. The TFT includes an active pattern 124' for forming a conductive channel between the source electrode 122 and the drain electrode 123 by a gate voltage supplied to the gate electrode 121. A common line 108 is formed in the pixel region actually in the same direction as that of the gate line 116.

The source electrode 122 and the drain electrode 123 are electrically connected to a source region and a drain region of the active pattern 124' through a first contact hole 140a and a second contact hole 140b formed on a first insulating film (not shown) and a second insulating film (not shown). Part of the source electrode 122 is extended to one direction to form part of the data line 117. Part of the drain electrode 123 is extended to the pixel region to be electrically connected to the pixel electrode 118 through a third contact hole 140c formed on a third insulating film (not shown). Part of the drain electrode 123 extended to the pixel region overlaps with the common line 108 disposed below with the second insulating film therebetween, for example, forming a storage capacitor.

The fabrication process of the array substrate will now be described in detail with reference to FIGS. 3A to 3F.

FIGS. 3A to 3F are cross-sectional views illustrating sequential steps of the fabrication process of the array substrate, taken along line II-II' of FIG. 2. A p channel TFT is formed in a pixel unit. The p channel TFT is also formed in a circuit unit.

Figure 3A:
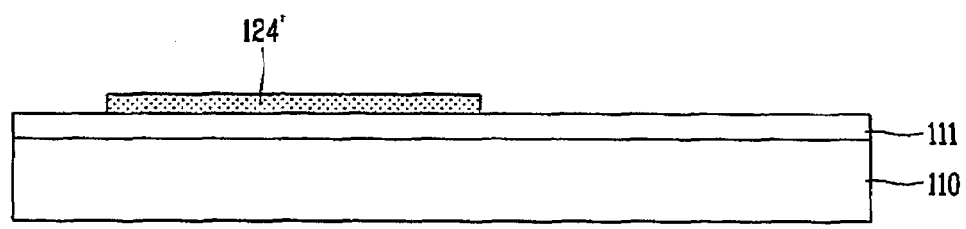
FIGS. 3A to 3F are cross-sectional views that illustrate sequential steps of a fabrication process of the array substrate, taken along line II-II' of FIG. 2.

As shown in FIG. 3A, a poly-Si thin film is formed by forming a buffer layer 111 and an amorphous silicon thin film on a substrate 110, and crystallizing the amorphous silicon thin film. An active pattern 124' is formed by patterning the poly-Si thin film by a photolithography process (first mask process).

Figure 3B:
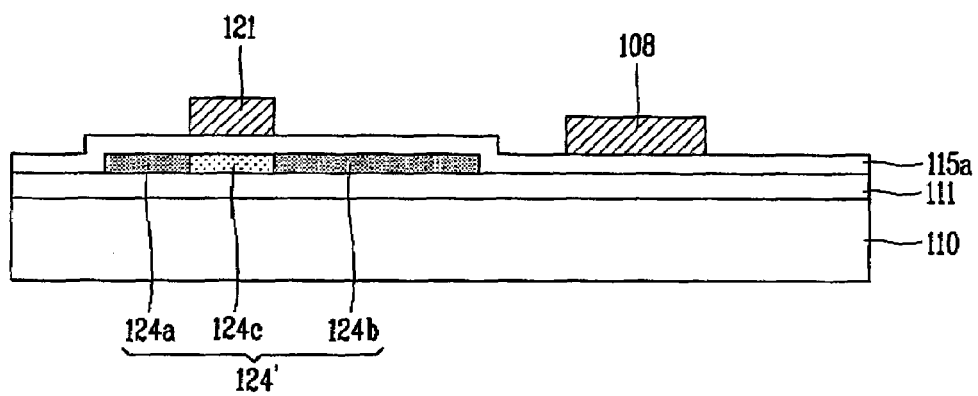

As depicted in FIG. 3B, a gate electrode 121 made of a first conductive film is formed on the active pattern 124' and a common line 108 made of the first conductive film is formed in the pixel region at the same time, by sequentially forming a first insulating film 115a and the first conductive film on the whole surface of the substrate 110, and selectively patterning the first conductive film by a photolithography process (second mask process).

The first conductive film may be made of a low resistance opaque conductive material, for example, Al, Al alloy, W, Cu, Cr or Mo to form the gate electrode 121 and the common line 108.

A p+ source region 124a and a p+ drain region 124b are formed by doping high concentration p+ ions into a predetermined region of the active pattern 124 using the gate electrode 121 as a mask.

Figure 3C:
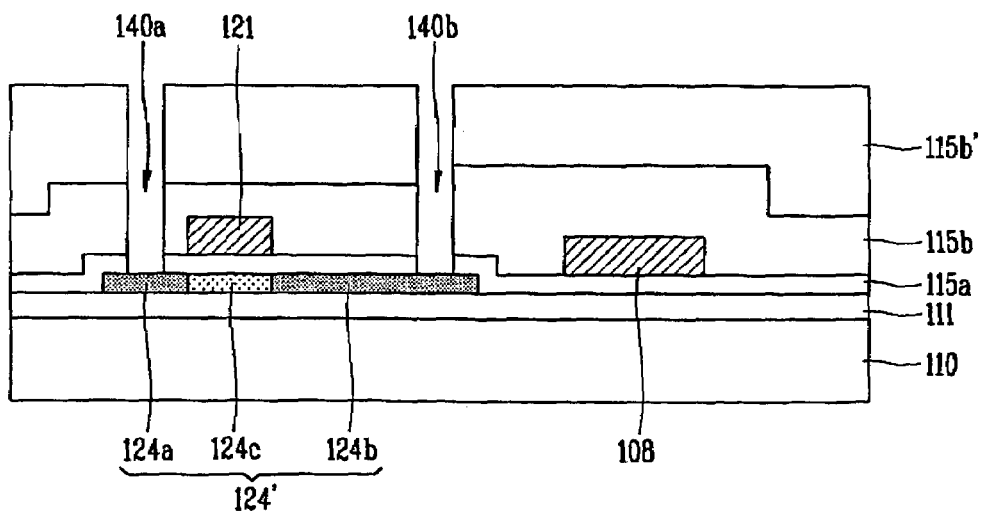

Referring to FIG. 3C, a first contact hole 140a partially exposes the source region 124a. A second contact hole 140b partially exposes the drain region 124b formed by depositing a first and second interlayer insulating films 115b and 115b' on the whole surface of the substrate 110, and partially removing the first insulating film 115a and the first and second interlayer insulating films 115b and 115b' by a photolithography process (third mask process).

Figure 3D:
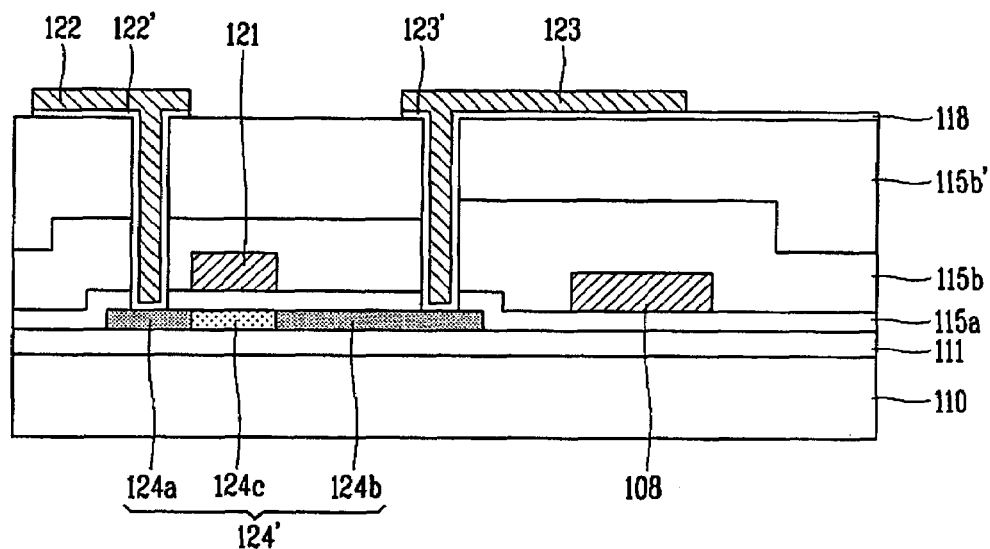

As illustrated in FIG. 3D, a source electrode 122 is electrically connected to the source region 124a through the first contact hole 140a. A drain electrode 123 is electrically connected to the drain region 124b through the second contact hole 140b. The source electrode 122 and the drain electrode 123 are formed by forming a second conductive film on the whole surface of the substrate 110, and patterning the second conductive film by a photolithography process (fourth mask process). Part of the source electrode 122 is extended to one direction to form the data line 117, and part of the drain electrode 123 is extended to the pixel region to overlap with the common line 108 disposed below with the second insulating film 115b' therebetween, for example, forming a storage capacitor.

Figure 3E:
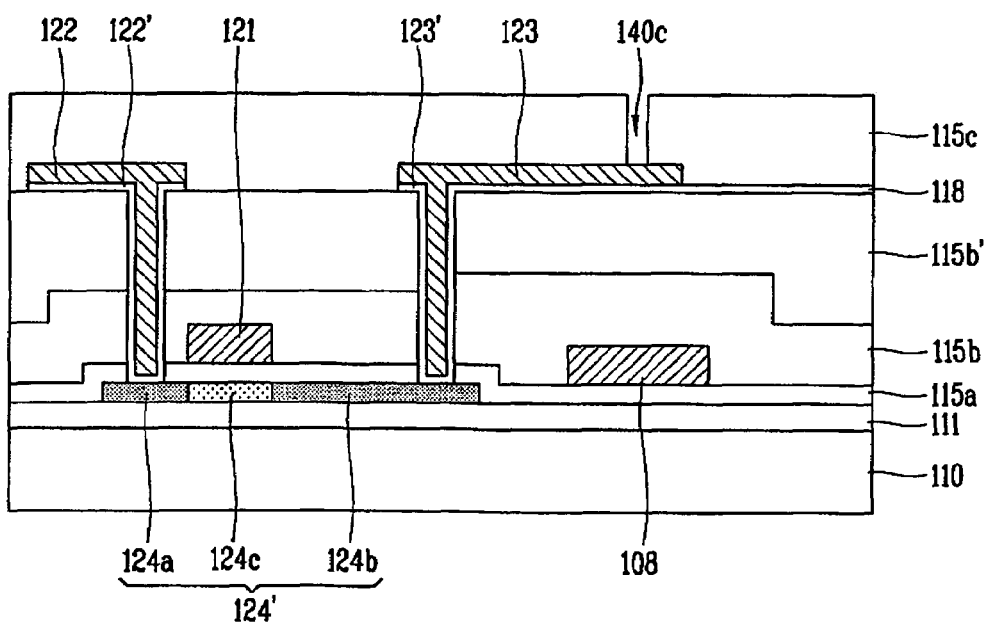

As shown in FIG. 3E, a third contact hole 140c partially exposes the drain electrode 123 that is formed by depositing a third insulating film 115c on the whole surface of the substrate 110, and patterning the third insulating film 115c by a photolithography process (fifth mask process).

Figure 3F:
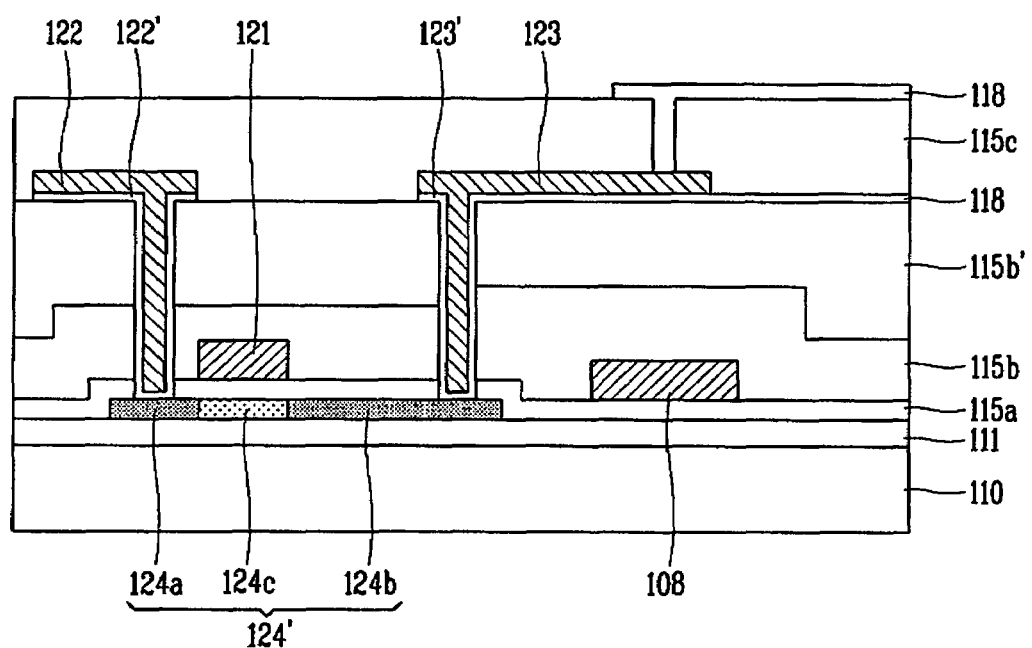

As depicted in FIG. 3F, a pixel electrode 118 is electrically connected to the drain electrode 123 through the third contact hole 140c and is formed by forming a third conductive film on the whole surface of the substrate 110 on which the third insulating film 115c has been formed, and selectively patterning the third conductive film by a photolithography process (sixth mask process).

The third conductive film may be made of a transparent conductive material having high transmissivity, for example, ITO and IZO to form the pixel electrode 118.

In the first exemplary embodiment, the p channel TFTs may be formed in the pixel unit and the circuit unit using the six mask processes. Alternatively, a second exemplary embodiment, described below, forms source/drain electrodes and pixel electrodes using a single mask process, and removes a contact hole mask process for the pixel electrodes, for example, omitting two mask processes. Contact holes for the source/drain electrodes and contact holes for the pixel electrodes are formed at the same time to form the source/drain electrodes and the pixel electrodes using a single mask process.

Figure 4:
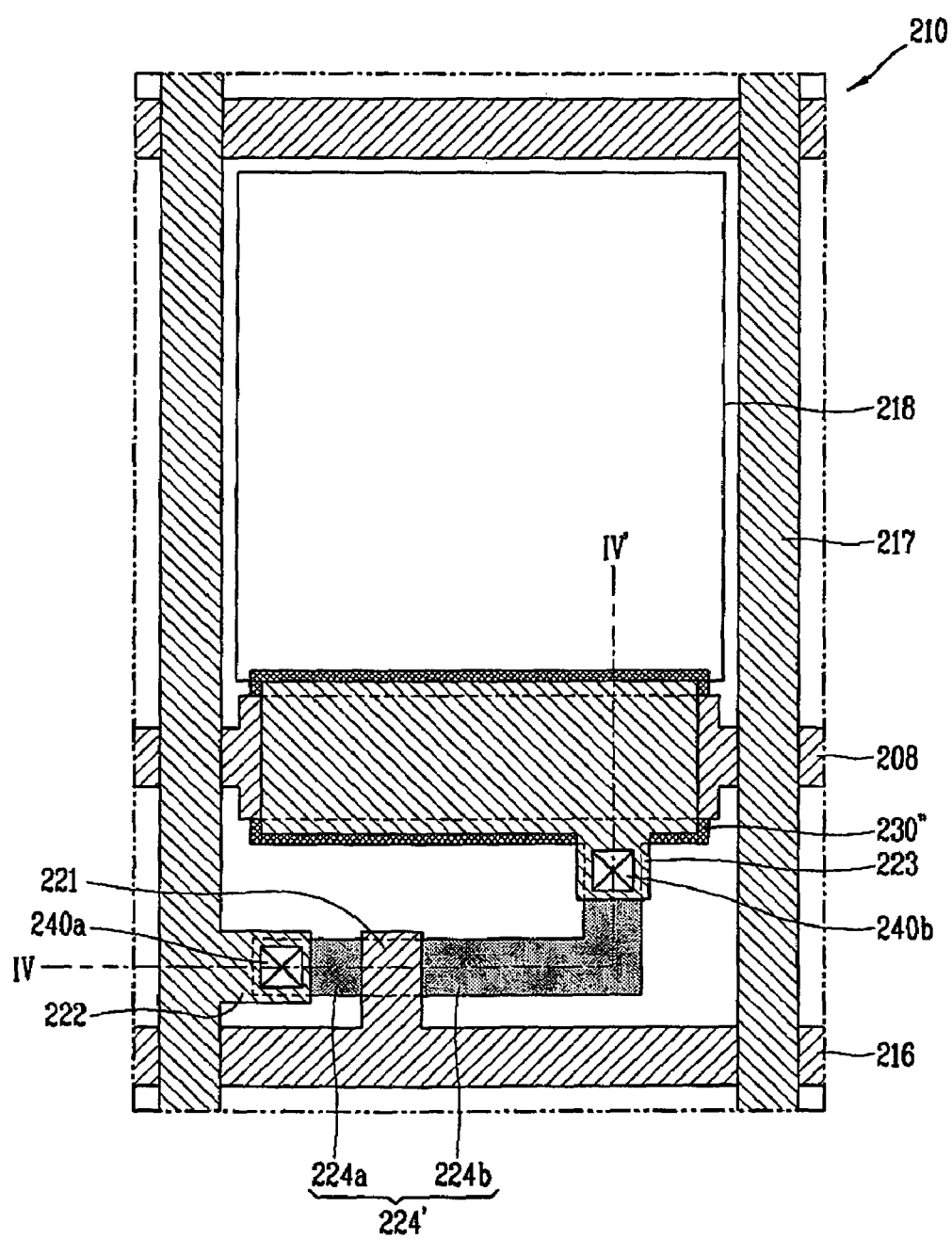
FIG. 4 is a schematic plane view that illustrates part of an array substrate of an LCD device in accordance with an exemplary embodiment.

FIG. 4 is a schematic plane view illustrating part of an array substrate of an LCD device in accordance with a second exemplary embodiment, for example, one pixel including a TFT in a pixel unit.

According to the second exemplary embodiment, as illustrated in FIG. 4, gate lines 216 and data lines 217 are arranged in the horizontal and vertical directions that define a pixel region and are formed on the array substrate 210. A TFT, which is a switching element, is formed in the crossing region of the gate line 216 and the data line 217. A pixel electrode 218 is connected to the TFT for driving liquid crystals (not shown) with a common electrode of a color filter substrate (not shown) and is formed in the pixel region.

The TFT includes a gate electrode 221 connected to the gate line 216, a source electrode 222 connected to the data line 217, and a drain electrode 223 connected to the pixel electrode 218. The TFT includes an active pattern 224' that forms a conductive channel between the source electrode 222 and the drain electrode 223 using a gate voltage supplied to the gate electrode 221.

The active pattern 224' is made of a poly-Si thin film and partially extends to the pixel region. A storage electrode 230" made of a conductive material is formed on the active pattern 224' extended to the pixel region. Alternatively, the active pattern 224' is not limited to extending to the pixel region, for example, the active pattern 224' may extend further or less than the pixel region.

A common line 208 is formed in the pixel region in the same direction as that of the gate line 216. The common line 208 overlaps with the storage electrode 230" disposed below with a first insulating film (not shown) therebetween, thereby forming a first storage capacitor. The storage electrode 230" is made of an opaque conductive material, and is formed with the active pattern 224' using a single mask process.

The source electrode 222 and the drain electrode 223 are electrically connected to a source region and a drain region of the active pattern 224' through a first contact hole 240a and a second contact hole 240b formed on the first insulating film, a first interlayer insulating film (not shown) and a second interlayer insulating film (not shown). Part of the source electrode 222 extends in one direction to form part of the data line 217. Part of the drain electrode 223 extends to the pixel region to be connected to the pixel electrode 218. Here, a source electrode pattern (not shown), a drain electrode pattern (not shown) and a data line pattern (not shown), which are made of a transparent conductive material and patterned in the same shapes as those of the source electrode 222, the drain electrode 223 and the data line 217 are formed under the source electrode 222, the drain electrode 223 and the data line 217. Part of the drain electrode pattern extends to the pixel region, for forming the pixel electrode 218.

Part of the drain electrode 223 that extends to the pixel region overlaps with the common line 208 disposed below with the second insulating film therebetween, for example, forming a second storage capacitor.

The source electrode pattern, the drain electrode pattern and the data line pattern may be made of a conductive material identically to the pixel electrode 218, for example, a transparent conductive material such as ITO and IZO.

In the array substrate 210 of the second embodiment, the source/drain electrodes 222 and 223, the data line 217, the source/drain electrode patterns, the data line pattern and the pixel electrode 218 may be formed by a single mask process using diffraction (or half-tone) mask. The contact hole forming process for the pixel electrode 218 is not necessary. The array substrate 210 may be fabricated by the four mask processes, which will now be explained in detail with reference to the method of fabricating the LCD device.

FIGS. 5A to 5D are cross-sectional views illustrating sequential steps of a fabrication process of the array substrate, taken along line IV-IV' of FIG. 4, and FIGS. 6A to 6D are plane views illustrating sequential steps of the fabrication process of the array substrate, taken along line IV-IV' of FIG. 4.

The second exemplary embodiment illustrates a driving circuit-integrated LCD device including p channel TFTs in a pixel unit and a circuit unit.

Figure 5A:
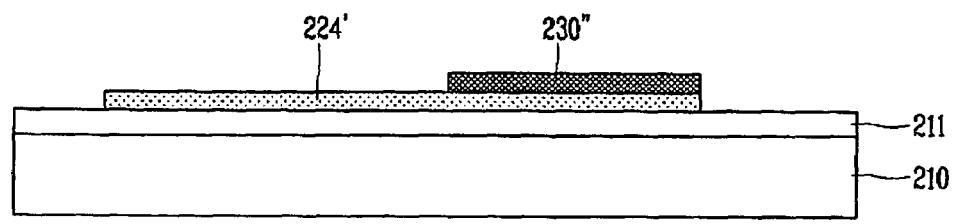
FIGS. 5A to 5D are cross-sectional views that illustrates sequential steps of a fabrication process of the array substrate, taken along line IV-IV' of FIG. 4.
Figure 6A:
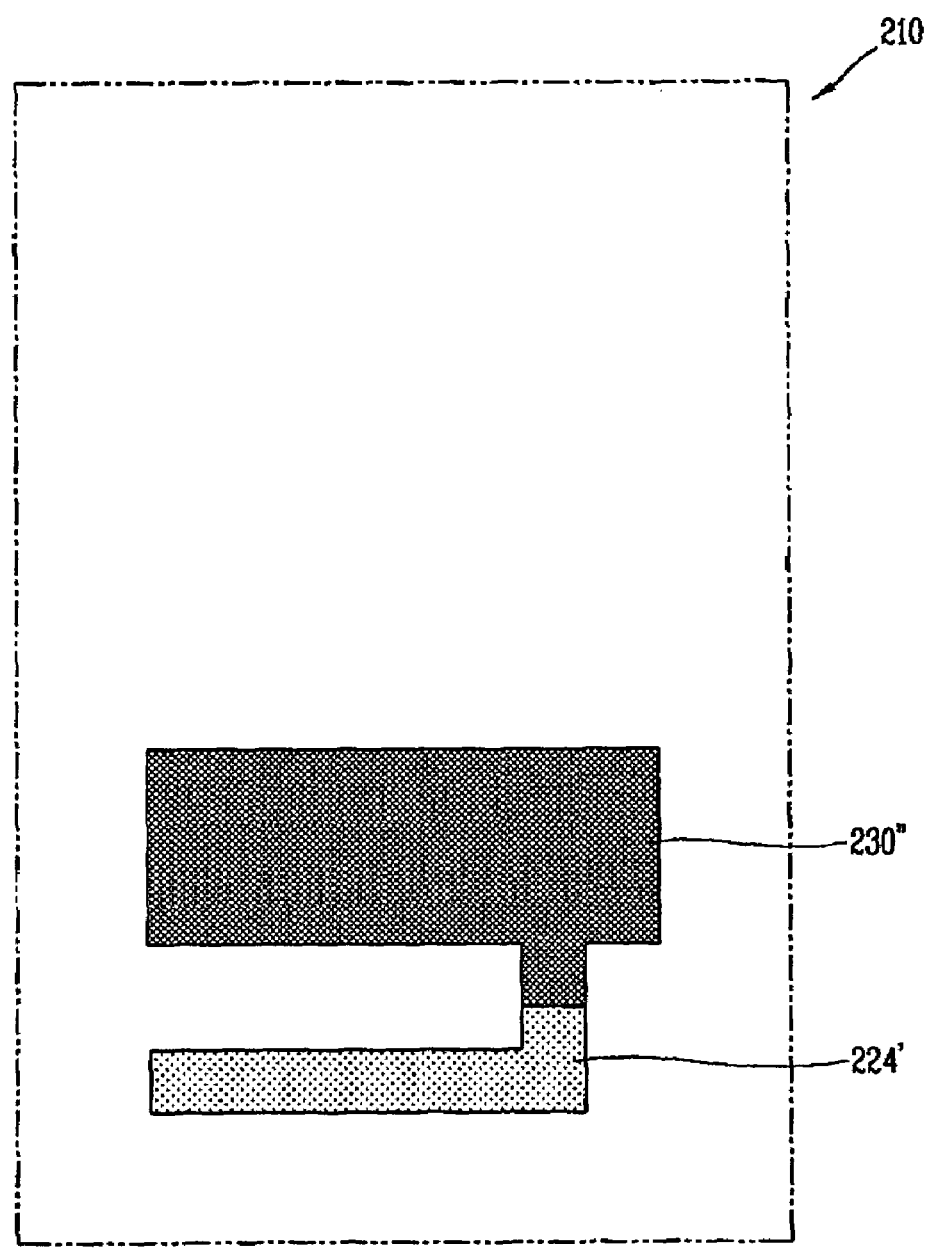
FIGS. 6A to 6D are plane views that illustrates sequential steps of the fabrication process of the array substrate, taken along line IV-IV' of FIG. 4.

As shown in FIGS. 5A and 6A, a poly-Si thin film is formed by forming a buffer layer 211 and an a-Si thin film on a substrate 210 made of a transparent insulating material such as glass, and crystallizing the a-Si thin film. The buffer layer 211 prevents impurities that exists in the substrate 210, for example, Na, from penetrating into the upper layers during the process.

An active pattern 224' and a storage electrode 230" are formed by forming a conductive film on the whole surface of the substrate 210 on which the poly-Si thin film has been formed, and patterning the conductive film by a photolithography process (first mask process). The active pattern 224' and the storage electrode 230" may be formed by single mask process by using diffraction mask, which will now be explained in detail.

Figure 7A:
FIGS. 7A to 7F are detailed cross-sectional views that illustrate a first mask process of FIGS. 5A and 6A.

FIGS. 7A to 7F are detailed cross-sectional views illustrating the first mask process of FIGS. 5A and 6A. As shown in FIG. 7A, a buffer layer 211 and an a-Si thin film 224 are formed on a substrate 210 made of a transparent insulating material, for example, glass. After the a-Si thin film is deposited on the substrate, the poly-Si thin film may be formed by various crystallization methods as follows.

The a-Si thin film may be deposited in various ways. The representative methods of depositing the a-Si thin film are low pressure chemical vapor deposition (LPCVD) and plasma enhanced chemical vapor deposition (PECVD).

The methods of crystallizing the a-Si thin film include, for example, solid phase crystallization (SPC) for annealing the a-Si thin film in a high temperature furnace, and eximer laser annealing (ELA) using a laser.

The ELA using the pulse type laser is generally used as laser crystallization. Recently, research has been on sequential lateral solidification (SLS) that improves crystallization properties by growing grains in the lateral direction.

A conductive film 230 made of, for example, a Mo or Al group conductive material is formed on the crystallized poly-Si thin film 224.

Figure 7B:
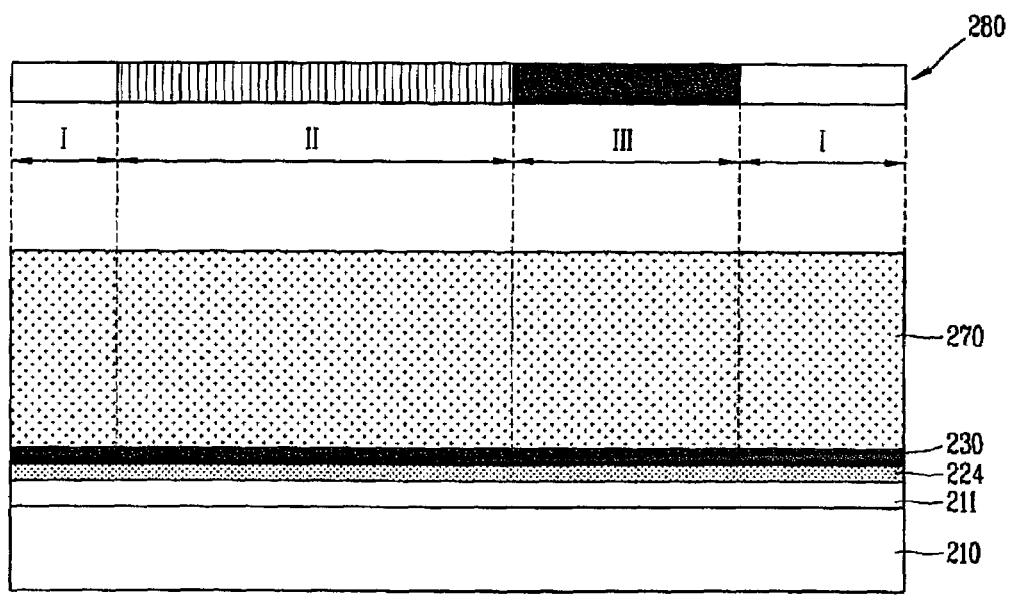

As shown in FIG. 7B, a photosensitive film 270 made of a photosensitive material such as photoresist is formed on the whole surface of the substrate 210, and light is selectively irradiated to the photosensitive film 270 through a diffraction mask 280.

A transmitting region I transmits the whole irradiated light. A slit region II partially transmits and intercepts light by slit patterns. An intercepting region III intercepts the whole irradiated light. The transmitting region I, slit region II, and intercepting region III are formed in the diffraction mask 280. The light transmitted through the diffraction mask 280 may be irradiated to the photosensitive film 270.

Figure 7C:
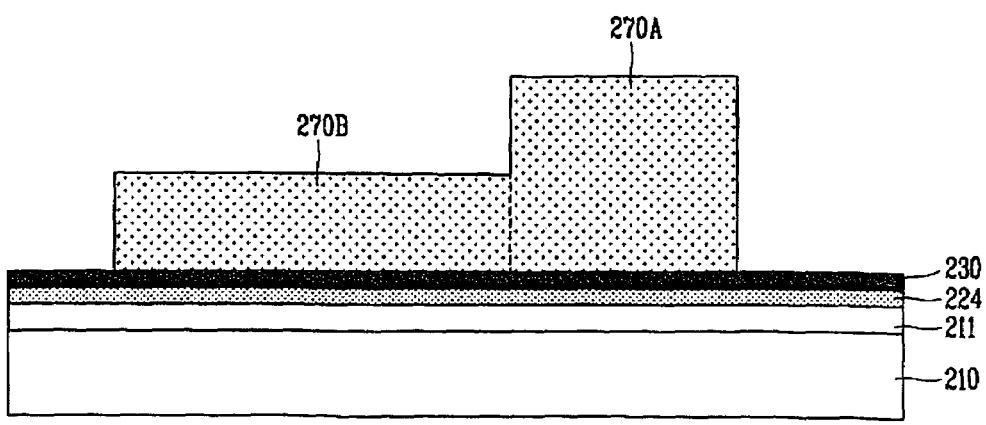

As shown in FIG. 7C, after the photosensitive film 270 exposed through the diffraction mask 280 is developed, a first photosensitive film pattern 270A and a second photosensitive film pattern 270B are left at a predetermined thickness in the regions corresponding to the intercepting region III and the slit region II which have wholly or partially intercepted light. The photosensitive film is completely removed in the region corresponding to the transmitting region I which has transmitted the whole light, for example, exposing the surface of the conductive film 230.

The first photosensitive film pattern 270A formed in the region corresponding to the intercepting region III is thicker than the second photosensitive film pattern 270B formed in the region corresponding to the slit region II. The photosensitive film is completely removed in the region that corresponds to the transmitting region I which has transmitted the whole light because a positive photoresist has been employed. The present embodiment is not limited to a positive photoresist, for example, a negative photoresist may also be used.

Figure 7D:
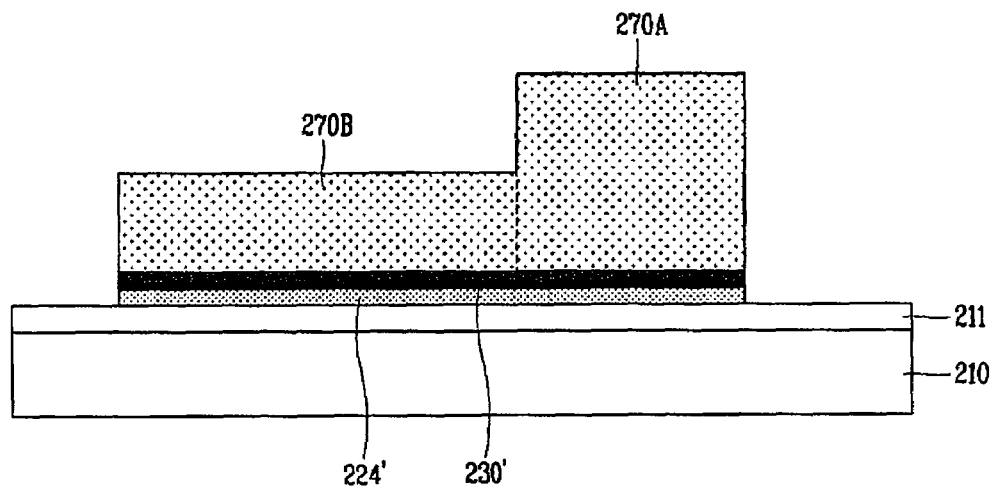

As shown in FIG. 7D, after the poly-Si thin film 224 and the conductive film 230 disposed below are selectively removed using the first photosensitive film pattern 270A and the second photosensitive film pattern 270B as a mask, an active pattern 224' made of the poly-Si thin film is formed on the substrate 210. A conductive film pattern 230' made of the conductive film and patterned in the same shape as that of the active pattern 224' is left on the active pattern 224'.

Figure 7E:
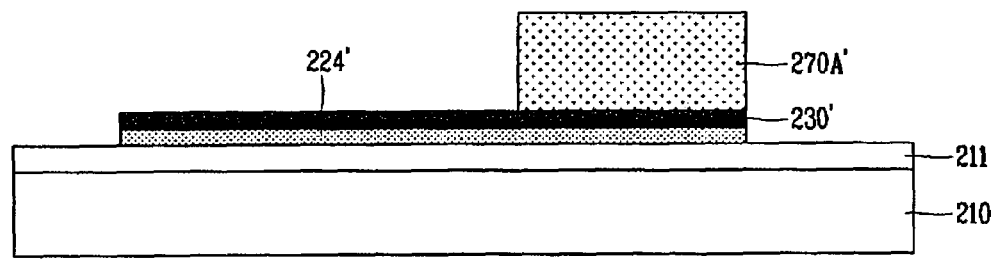

As shown in FIG. 7E, after an ashing process partially removes the first photosensitive film pattern 270A and the second photosensitive film pattern 270B is carried out, the upper portion of the active pattern 224', for example, the second photosensitive film pattern 270B that corresponds to the diffraction exposure-applied slit region II is completely removed, for example, to expose the surface of the conductive film 230'.

The first photosensitive film pattern 270A is removed as thick as the second photosensitive film pattern 270B, and thus left on the region corresponding to the intercepting region III as a third photosensitive film pattern 270A'.

Figure 7F:
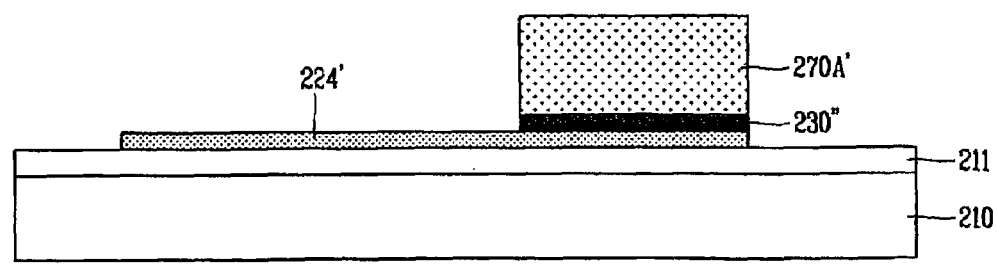

Referring to FIG. 7F, after the conductive film pattern 230' is partially removed using the remaining third photosensitive film pattern 270A' as a mask, a storage electrode 230" made of the conductive film is formed.

Figure 5B:
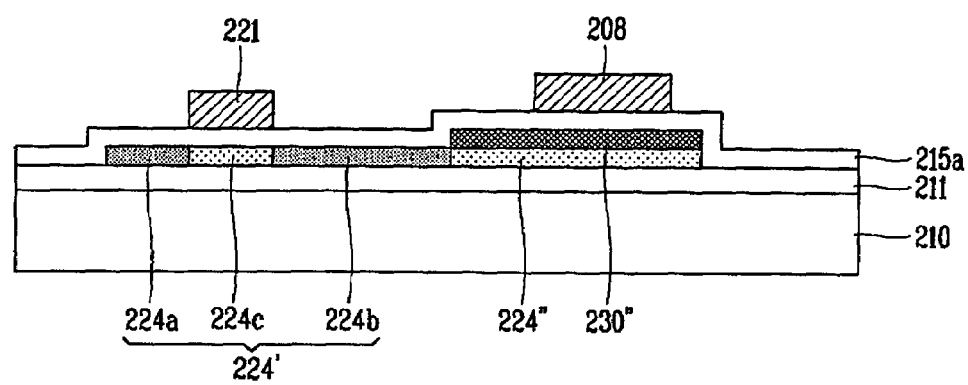
Figure 6B:
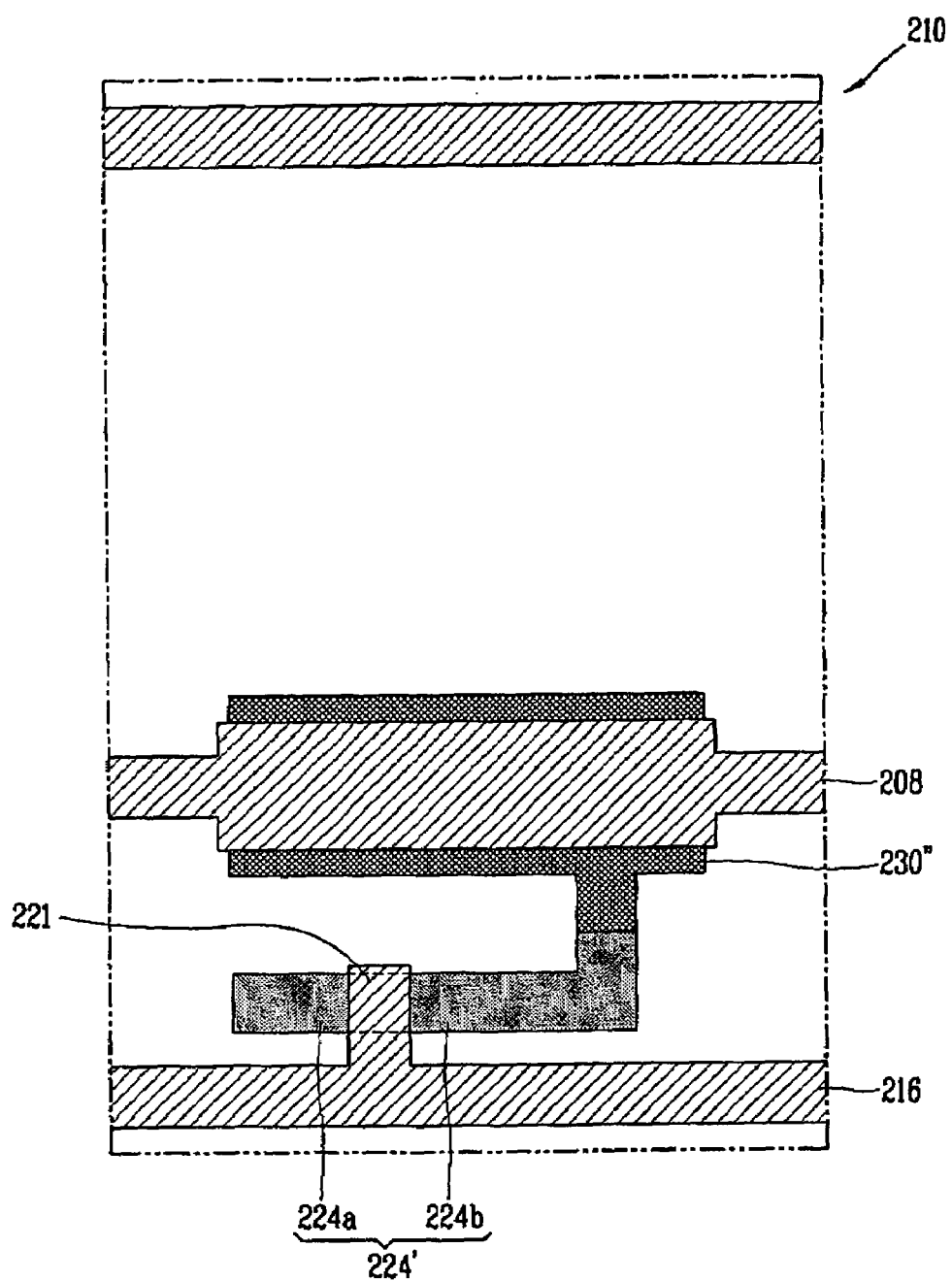

As depicted in FIGS. 5B and 6B, a gate electrode 221 made of a first conductive film is formed on the active pattern 224' and a common line 208 made of the first conductive film is formed on the storage electrode 230" at the same time, by sequentially forming a first insulating film 215a and the first conductive film on the whole surface of the substrate 210, and selectively patterning the first conductive film by a photolithography process (second mask process).

The first conductive film may be made of a low resistance opaque conductive material, for example, Al, Al alloy, W, Cu, Cr or Mo to form the gate electrode 221, the gate line 217 and the common line 208. The common line 208 of the pixel unit overlaps with the storage electrode 230" disposed below with the first insulating film 215a therebetween, for example, forming a first storage capacitor.

A p+ source region 224a and a p+ drain region 224b are formed by doping high concentration p+ ions into a predetermined region of the active pattern 224' using the gate electrode 221 as a mask. Reference numeral 224c denotes a p channel region for forming a conductive channel between the p+ source region 224a and the p+ drain region 224b.

Figure 5C:
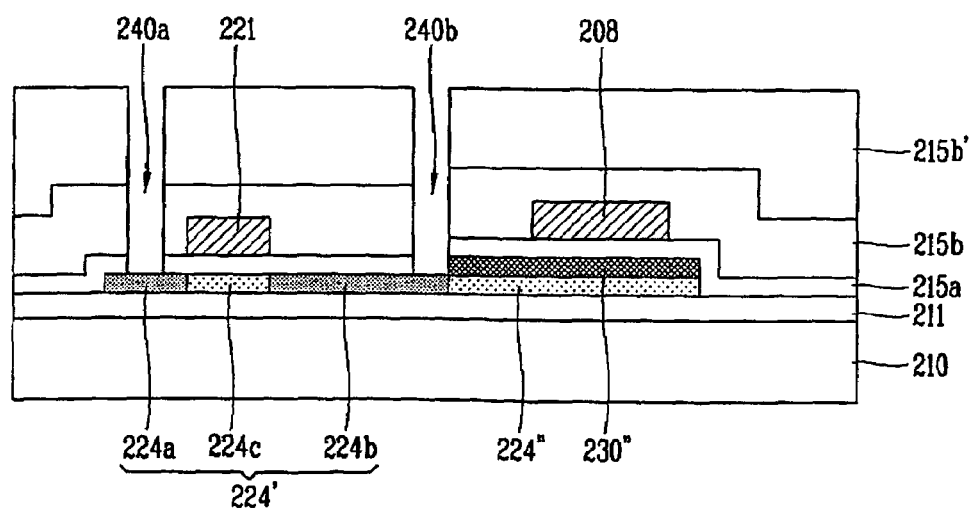
Figure 6C:
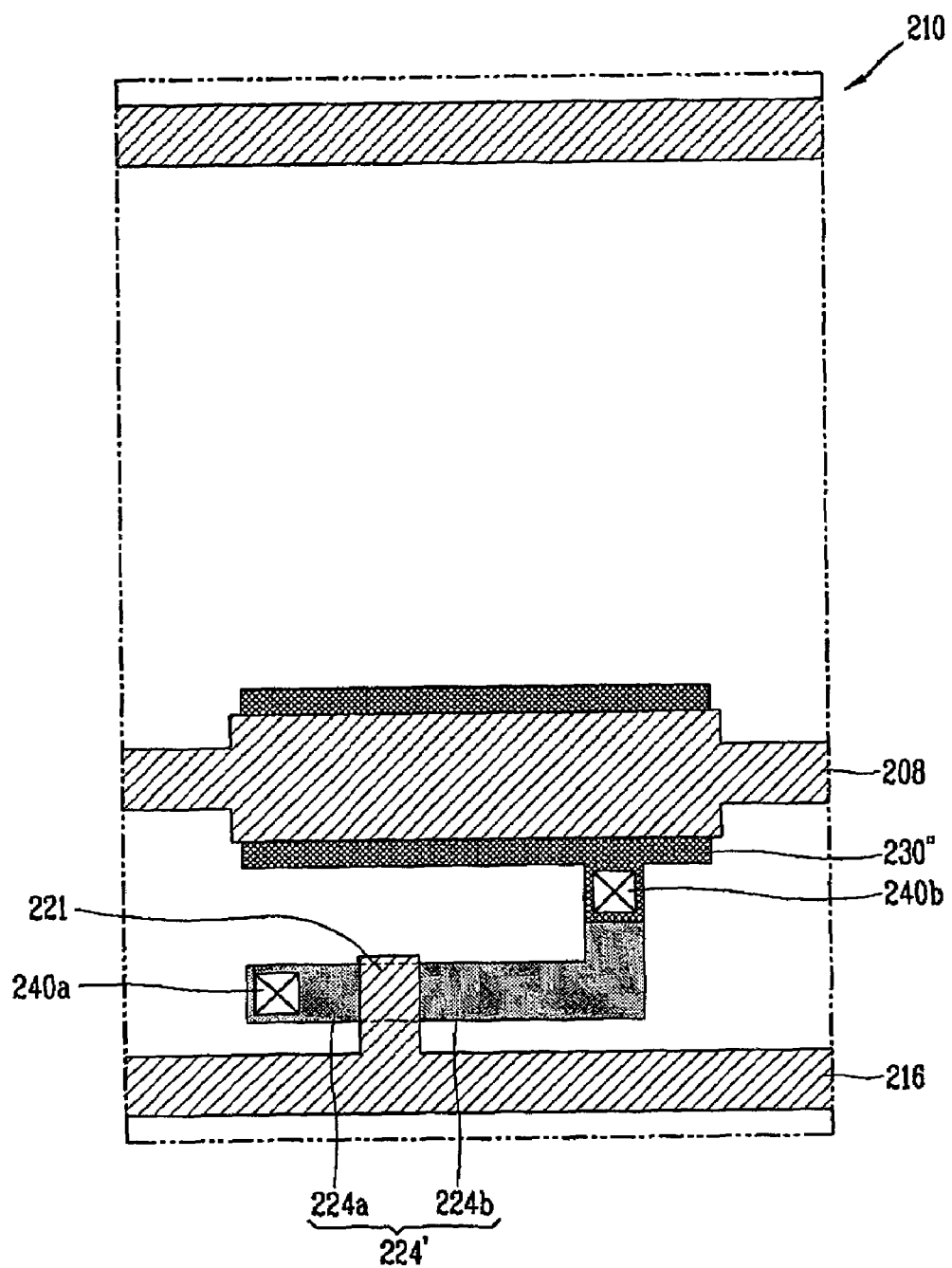

Referring to FIGS. 5C and 6C, a first contact hole 240a and a second contact hole 240b partially expose the source region 224a and the drain region 224b. The first contact hole 240a and the second contact hole 240b are formed by depositing a first interlayer insulating film 215b and a second interlayer insulating film 215b' on the whole surface of the substrate 210, and partially removing the first insulating film 215a, the first interlayer insulating film 215b and the second interlayer insulating film 215b' by a photolithography process (third mask process).

A double film of SiNx/SiO$_2$ may be used as the first and second interlayer insulating films 215b and 215b'. SiO$_2$ is deposited and activation-annealed to form the first interlayer insulating film 215b, and SiNx is deposited and hydrogenation-annealed to form the second interlayer insulating film 215b'. Alternatively, SiNx/SiO$_2$ may be deposited and annealed for hydrogenation and activation at the same time, for forming the first and second interlayer insulating films 215b and 215b'. In another exemplary embodiment, a single film of SiNx or a triple film of SiO$_2$/SiNx/SiO$_2$ may be applied to the first and second interlayer insulating films 215b and 215b'.

The second contact hole 240b may be formed to partially expose the drain region 224b and the storage electrode 230". In another embodiment, two second contact holes may be formed to individually partially expose the drain region 224b and the storage electrode 230", and connected to each other by the drain electrode 223.

Figure 5D:
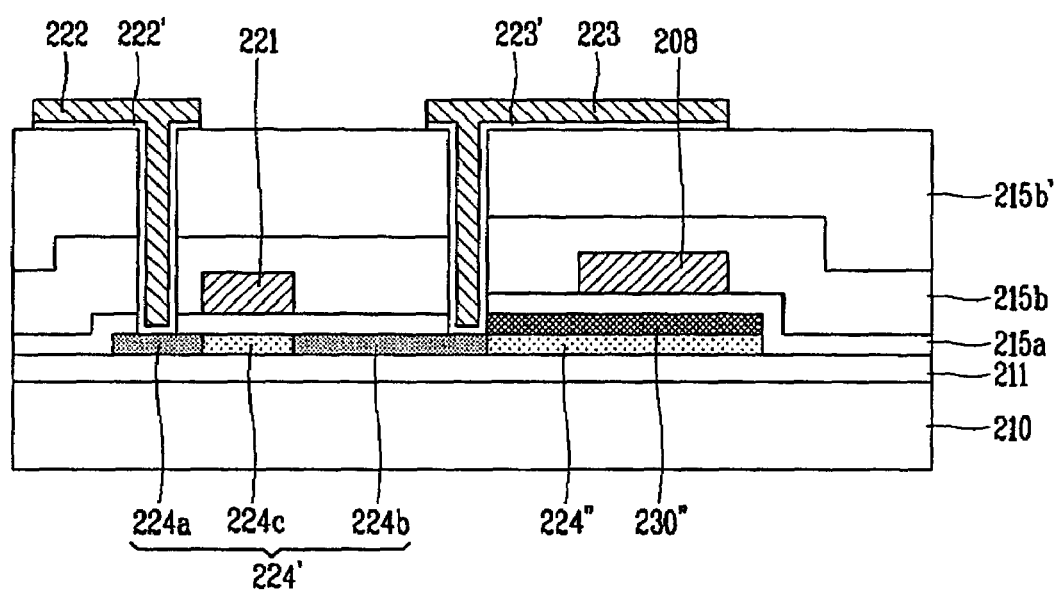
Figure 6D:
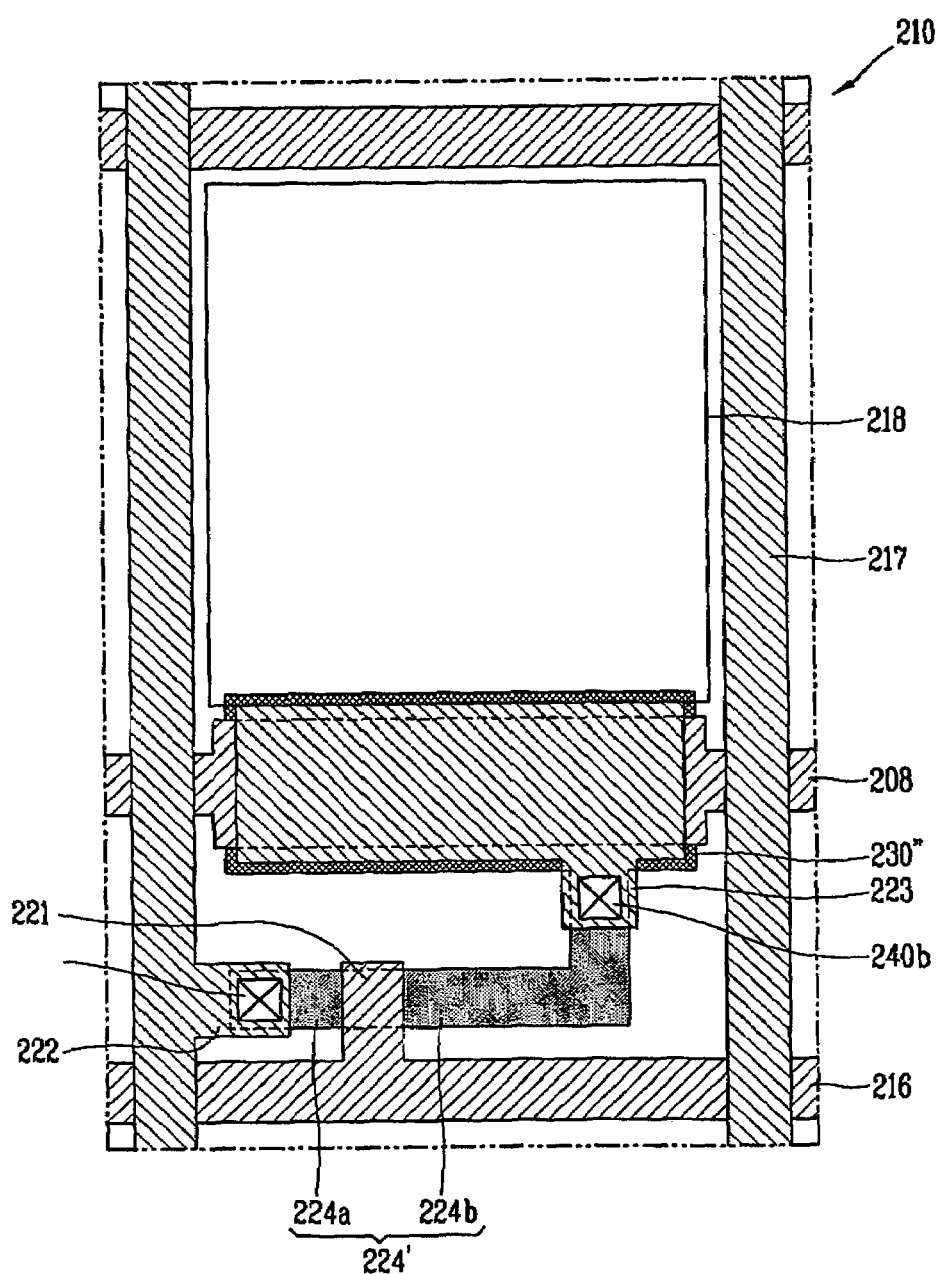

As illustrated in FIGS. 5D and 6D, a source electrode 222, a drain electrode 223 and a data line 217 made of a third conductive film and a pixel electrode 218 made of a second conductive film are formed at the same time by single mask process (fourth mask process), by sequentially depositing the second conductive film and the third conductive film on the whole surface of the substrate 210, and patterning the second conductive film and the third conductive film by two etching processes by using diffraction exposure. A source electrode pattern 222', a drain electrode pattern 223' and a data line pattern 217' which are made of the second conductive film and which have their sides patterned in the same shapes as those of the source electrode 222, the drain electrode 223 and the data line 217 are formed under the source electrode 222, the drain electrode 223 and the data line 217. Part of the data line pattern 217' is extended to the pixel region, for example, for forming the pixel electrode 218.

In the second exemplary embodiment, the active pattern 224' made of the poly-Si thin film and the storage electrode 230" made of the conductive material may be formed using a single mask process by using diffraction (or half-tone) mask. The capacity of the storage capacitor may be improved without adding a mask process.

Figure 8:
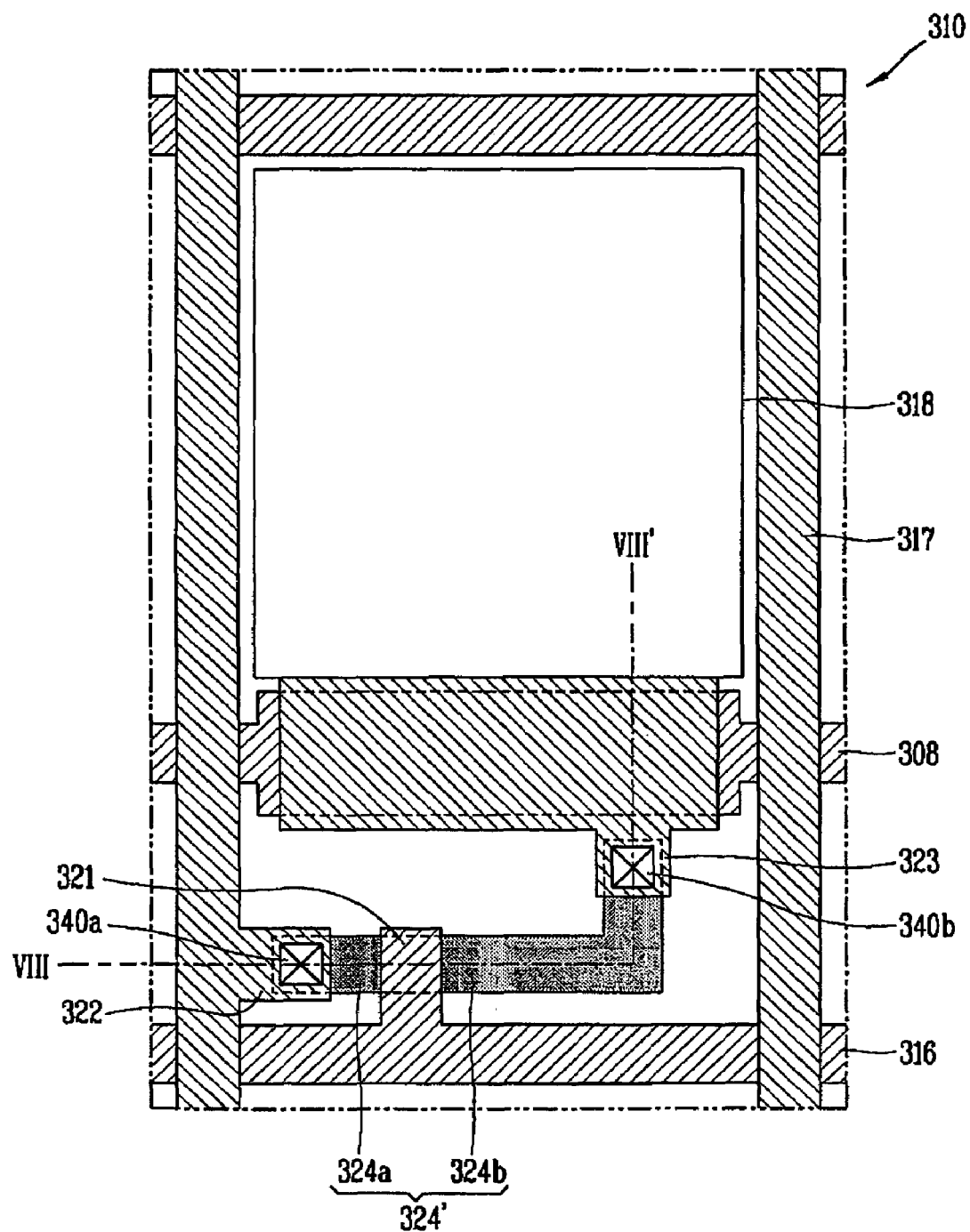
FIG. 8 is a schematic plane view that illustrates part of an array substrate of an LCD device in accordance with an exemplary embodiment.

In a third exemplary embodiment, as shown in FIG. 8, an LCD device does not have a storage electrode.

FIG. 8 is a schematic plane view illustrating part of an array substrate of the LCD device in accordance with a third exemplary embodiment, for example, one pixel including a TFT in a pixel unit.

In accordance with the third exemplary embodiment, as illustrated in FIG. 8, gate lines 316 and data lines 317 are arranged in horizontal and vertical directions that define a pixel region formed on the array substrate 310. A TFT that is a switching element is formed in the crossing region of the gate line 316 and the data line 317. A pixel electrode 318 connected to the TFT for driving liquid crystals (not shown) with a common electrode of a color filter substrate (not shown) is formed in the pixel region.

The TFT includes a gate electrode 321 connected to the gate line 316, a source electrode 322 connected to the data line 317, and a drain electrode 323 connected to the pixel electrode 318. The TFT includes an active pattern 324' that forms a conductive channel between the source electrode 322 and the drain electrode 323 using a gate voltage supplied to the gate electrode 321. A common line 308 is formed in the pixel region in the same direction as that of the gate line 316.

The source electrode 322 and the drain electrode 323 are electrically connected to a source region and a drain region of the active pattern 324' through a first contact hole 340a and a second contact hole 340b formed on the first insulating film, a first interlayer insulating film (not shown) and a second interlayer insulating film (not shown). Part of the source electrode 322 is extended in one direction to form part of the data line 317. Part of the drain electrode 323 is extended to the pixel region to be connected to the pixel electrode 318. A source electrode pattern (not shown), a drain electrode pattern (not shown) and a data line pattern (not shown), which are made of a transparent conductive material and patterned in the same shapes as those of the source electrode 322, the drain electrode 323 and the data line 317 are formed under the source electrode 322, the drain electrode 323 and the data line 317. Part of the drain electrode pattern extends to the pixel region, for example, for forming the pixel electrode 318.

Part of the drain electrode 323 extends to the pixel region that overlaps with the common line 308 disposed below with the second insulating film therebetween, for example, forming a storage capacitor.

The source electrode pattern, the drain electrode pattern and the data line pattern may be made of a conductive material identical to the pixel electrode 318, for example, a transparent conductive material such as ITO and IZO.

In the array substrate 310 of the third embodiment, the source/drain electrodes 322 and 323, the data line 317, the source/drain electrode patterns, the data line pattern and the pixel electrode 318 may be formed by single mask process using diffraction mask. The contact hole forming process for the pixel electrode 318 is not necessary. As a result, the array substrate 310 may be fabricated by the four mask processes, which will now be explained in detail with reference to the method of fabricating the LCD device.

FIGS. 9A to 9D are cross-sectional views illustrating sequential steps of a fabrication process of the array substrate, taken along line VIII-VIII' of FIG. 8, and FIGS. 10A to 10D are plane views illustrating sequential steps of the fabrication process of the array substrate, taken along line VIII-VIII' of FIG. 8.

Figure 9A:
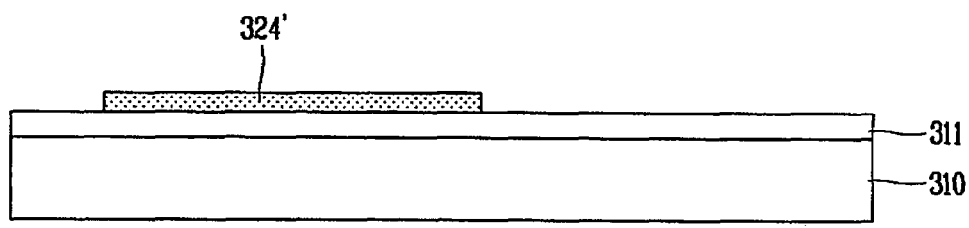
FIGS. 9A to 9D are cross-sectional views that illustrates sequential steps of a fabrication process of the array substrate, taken along line VIII-VIII' of FIG. 8.
Figure 10A:
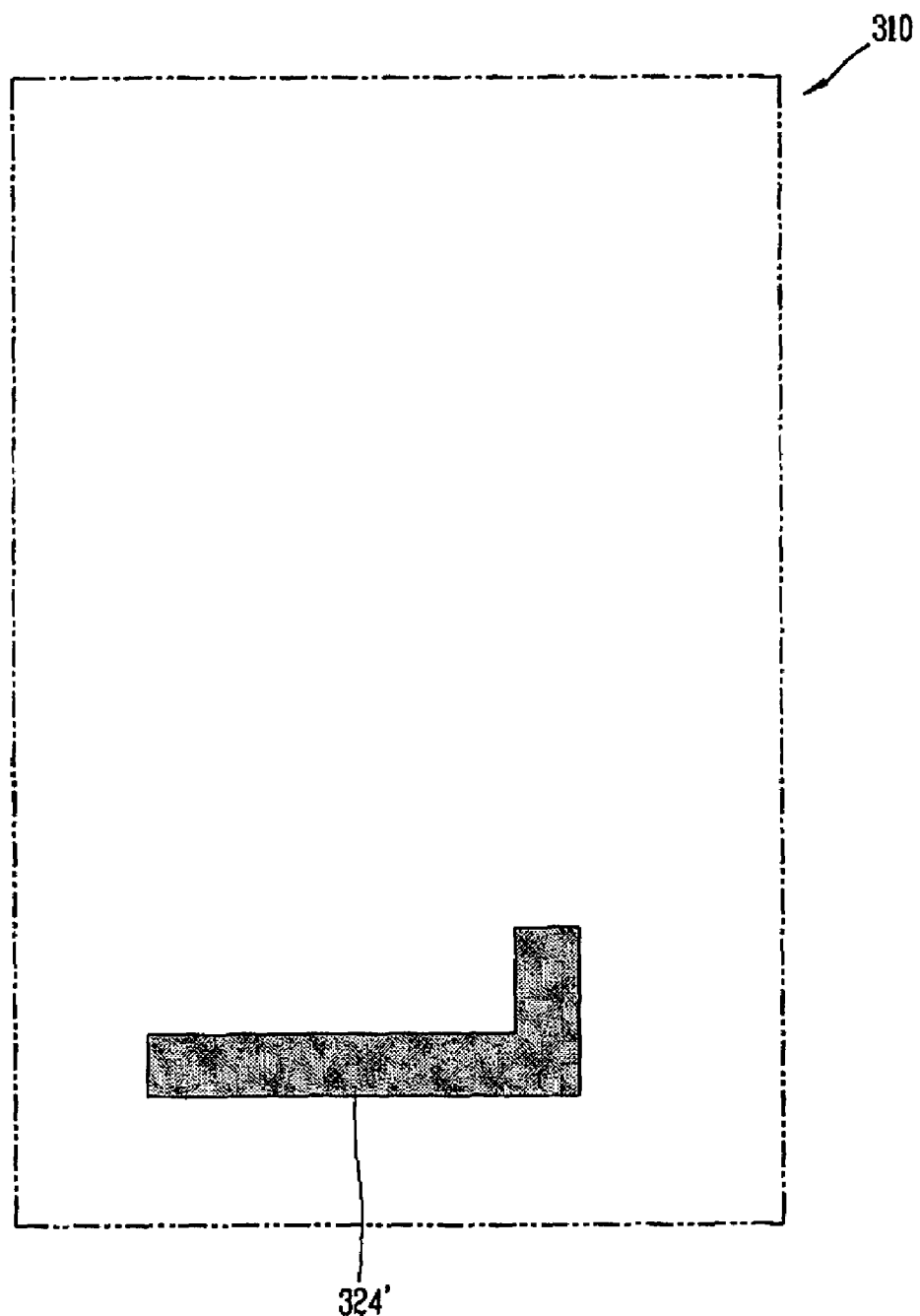
FIGS. 10A to 10D are plane views that illustrates sequential steps of the fabrication process of the array substrate, taken along line VIII-VIII' of FIG. 8.

As shown in FIGS. 9A and 10A, a poly-Si thin film is formed by forming a buffer layer 311 and an a-Si thin film on a substrate 310 made of a transparent insulating material for example, glass, and crystallizing the a-Si thin film. An active pattern 324' is formed by patterning the poly-Si thin film by a photolithography process (first mask process).

Figure 9B:
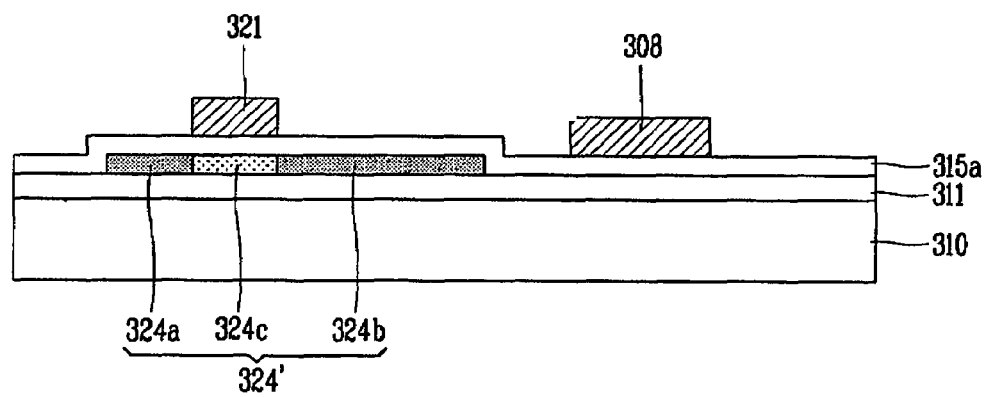
Figure 10B:
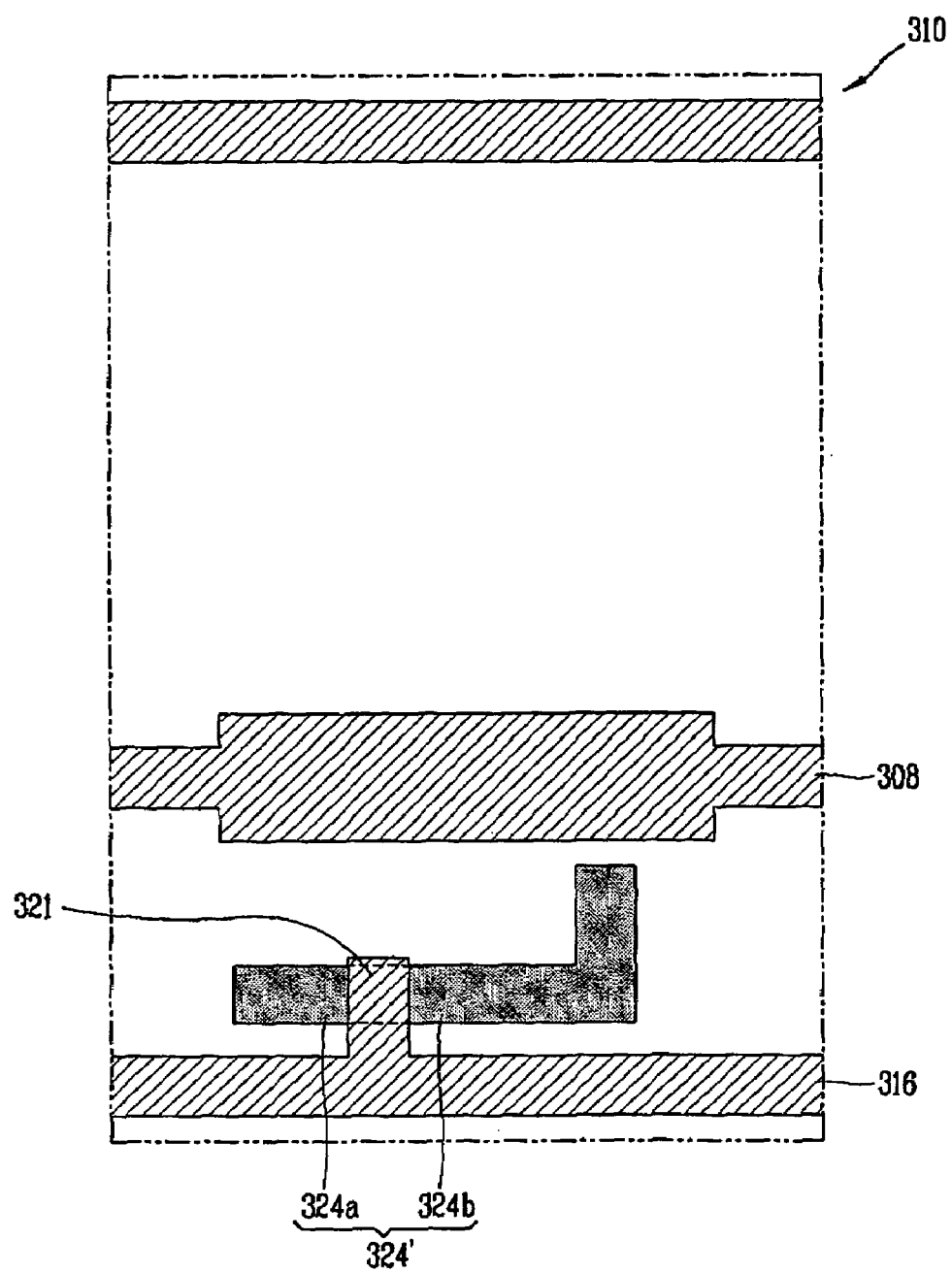

As depicted in FIGS. 9B and 10B, a gate electrode 321 made of a first conductive film is formed on the active pattern 324' and a common line 308 made of the first conductive film is formed in the pixel region at the same time, by sequentially forming a first insulating film 315a and the first conductive film on the whole surface of the substrate 310, and selectively patterning the first conductive film by a photolithography process (second mask process).

A p+ source region 324a and a p+ drain region 324b are formed by doping high concentration p+ ions into a predetermined region of the active pattern 324 using the gate electrode 321 as a mask. Reference numeral 324c denotes a p channel region for forming a conductive channel between the p+ source region 324a and the p+ drain region 324b.

Figure 9C:
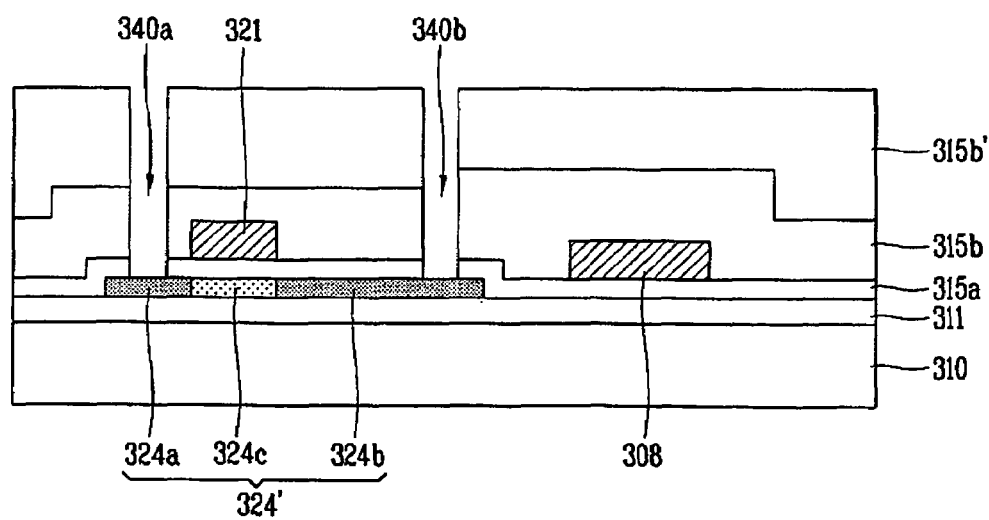
Figure 10C:
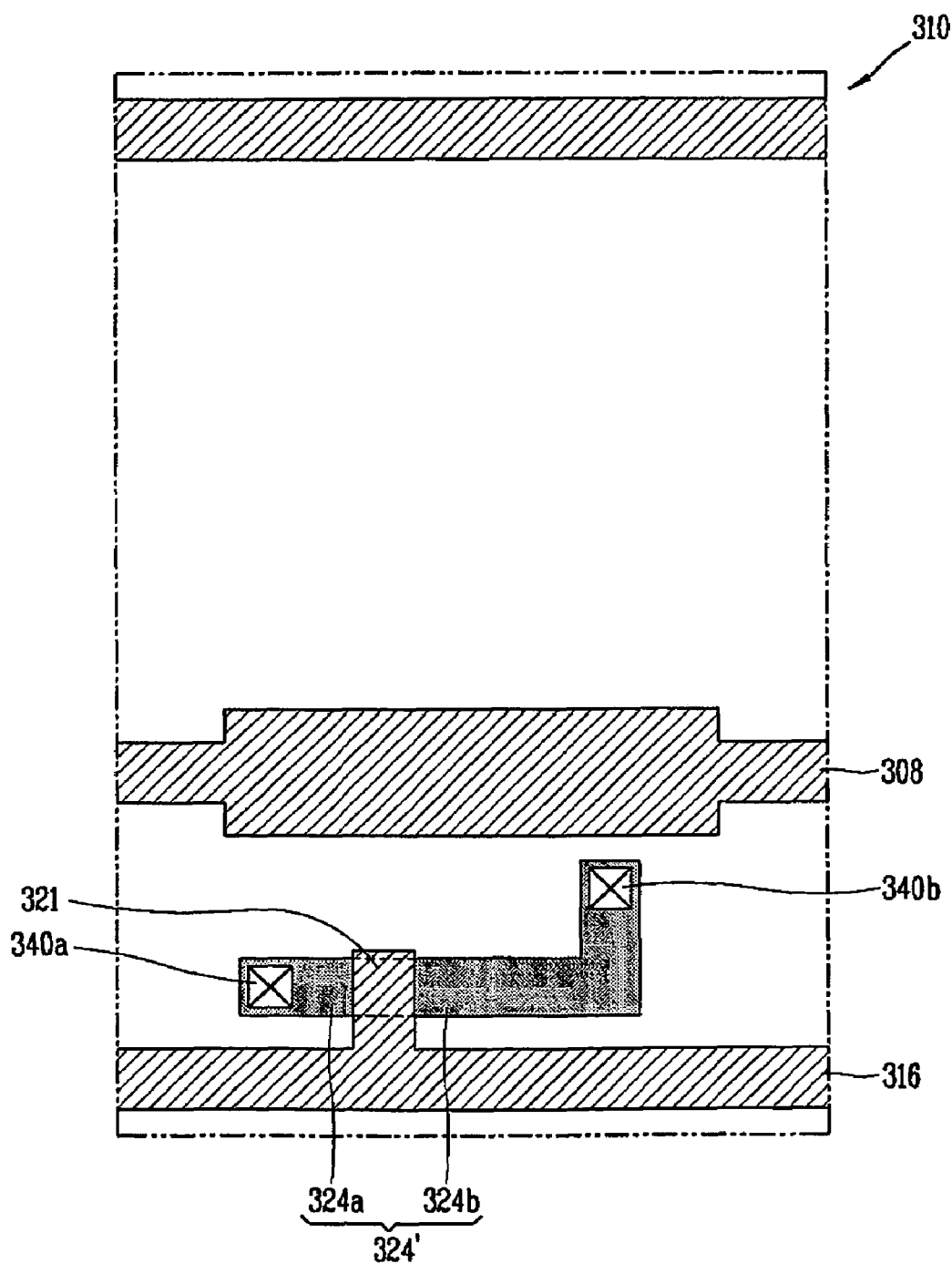

Referring to FIGS. 9C and 10C, a first contact hole 340a and a second contact hole 340b partially exposes the source region 324a and the drain region 324b formed by depositing a first interlayer insulating film 315b and a second interlayer insulating film 315b' on the whole surface of the substrate 310, and partially removes the first insulating film 315a, the first interlayer insulating film 315b and the second interlayer insulating film 315b' by a photolithography process (third mask process).

Figure 9D:
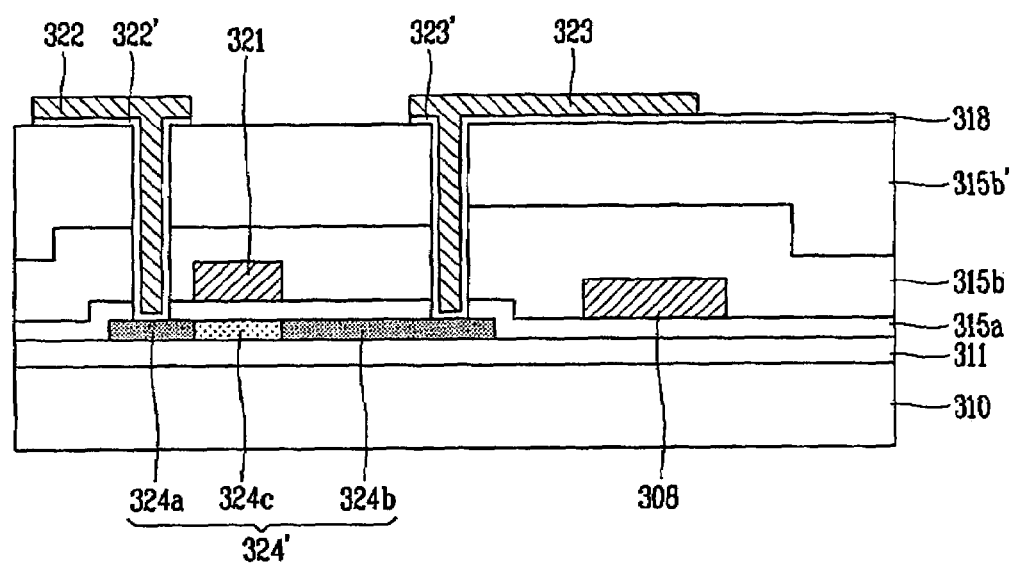
Figure 10D:
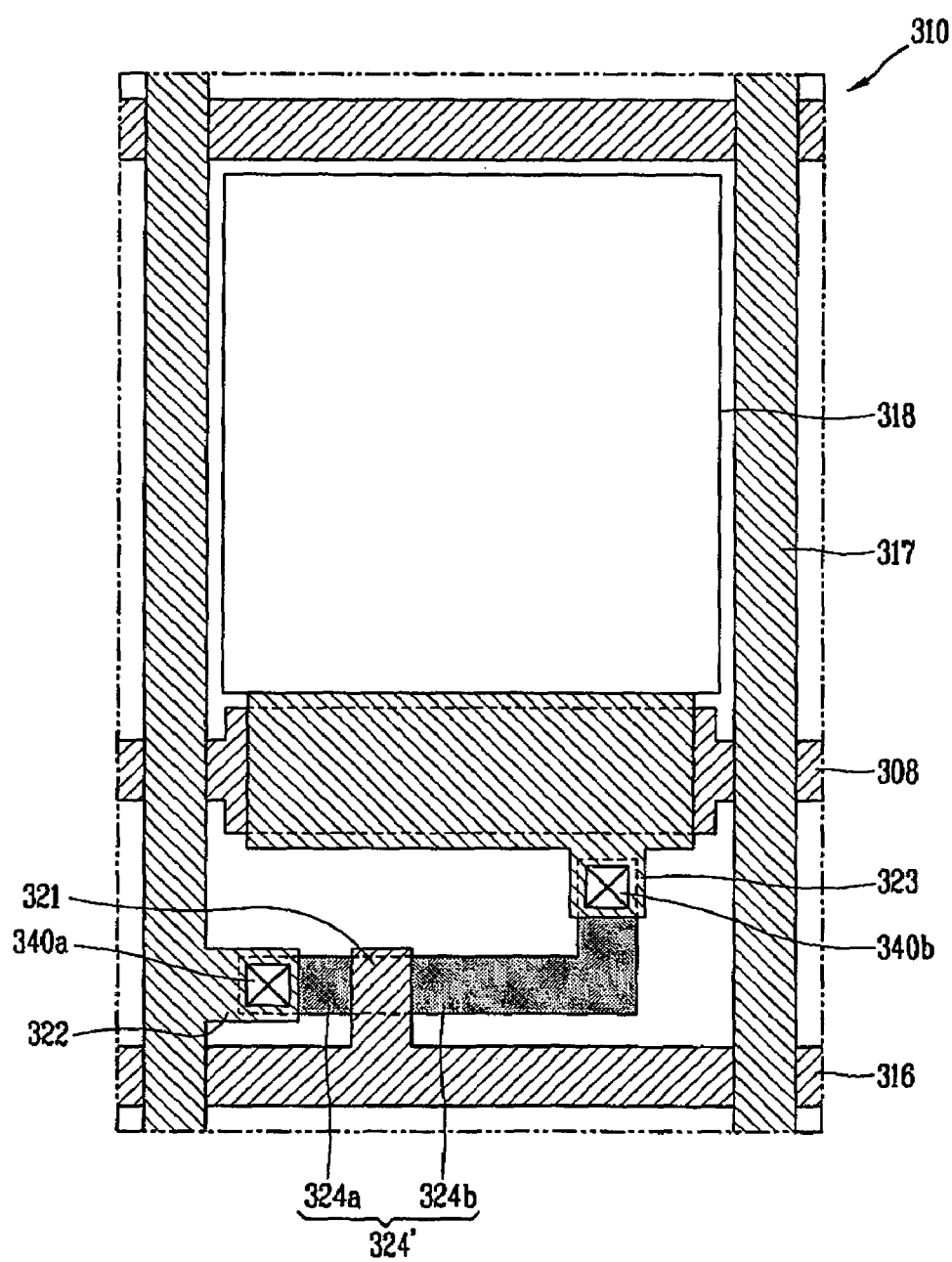

As illustrated in FIGS. 9D and 10D, a source electrode 322, a drain electrode 323 and a data line 317 made of a third conductive film and a pixel electrode 318 made of a second conductive film are formed at the same time using a single mask process (fourth mask process), by sequentially depositing the second conductive film and the third conductive film on the whole surface of the substrate 310, and patterning the second conductive film and the third conductive film by two etching processes by using diffraction mask. A source electrode pattern 322', a drain electrode pattern 323' and a data line pattern 317' which are made of the second conductive film and which have their sides patterned in the same shapes as those of the source electrode 322, the drain electrode 323 and the data line 317 are formed under the source electrode 322, the drain electrode 323 and the data line 317. Part of the data line pattern 317' is extended to the pixel region, for forming the pixel electrode 318.

Figure 11A:
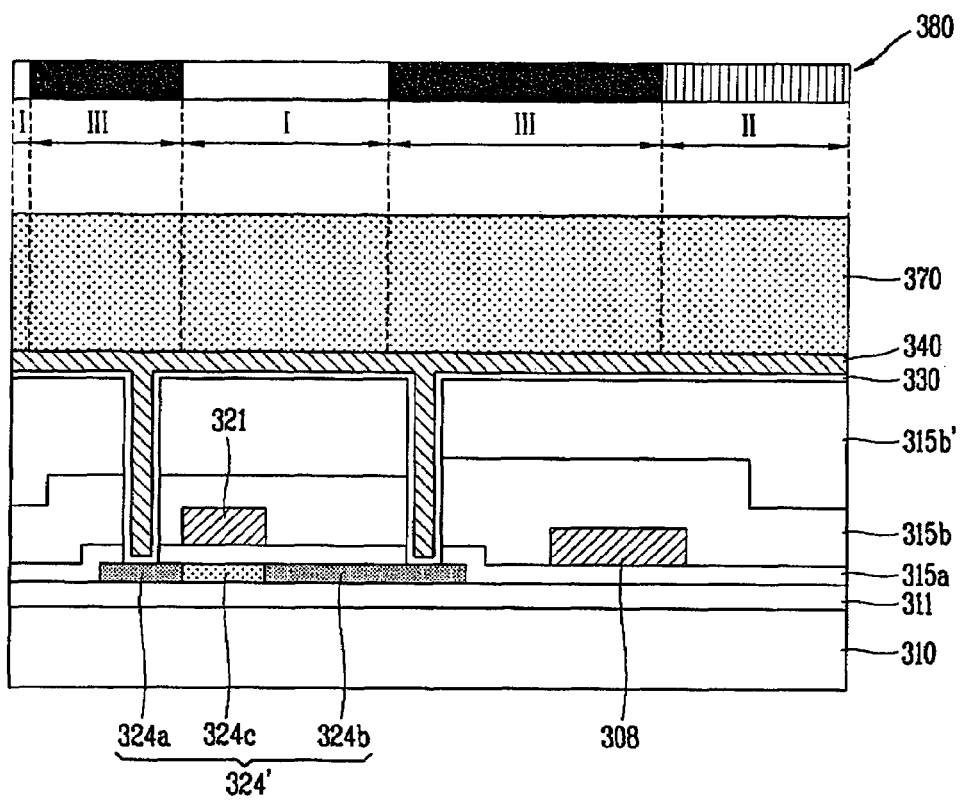
FIGS. 11A to 11E are detailed cross-sectional views that illustrate a fourth mask process of FIGS. 9D and 10D.

The fourth mask process will now be described in detail with reference to FIGS. 11A to 11E. Referring to FIG. 11A, a second conductive film 330, a third conductive film 340 and a photosensitive film 370 are formed on the whole surface of the substrate 310 including the inside portions of the first contact hole 340a and the second contact hole 340b. Light is selectively irradiated to the photosensitive film 370 through a diffraction mask 380.

The second conductive film 330 may be made of a transparent conductive material such as ITO and IZO to form the pixel electrode, and the third conductive film 340 may be made of a low resistance opaque conductive material, for example, Al, Al alloy, W, Cu, Cr or Mo to form the source electrode, the drain electrode and the data line.

A transmitting region I transmits the whole irradiated light. A slit region II partially transmits and intercepts light by slit patterns. An intercepting region III intercepts the whole irradiated light. The transmitting region I, slit region II, and intercepting region III are formed in the diffraction mask 380. The light transmitted through the diffraction mask 380 may be irradiated to the photosensitive film 370.

Figure 11B:
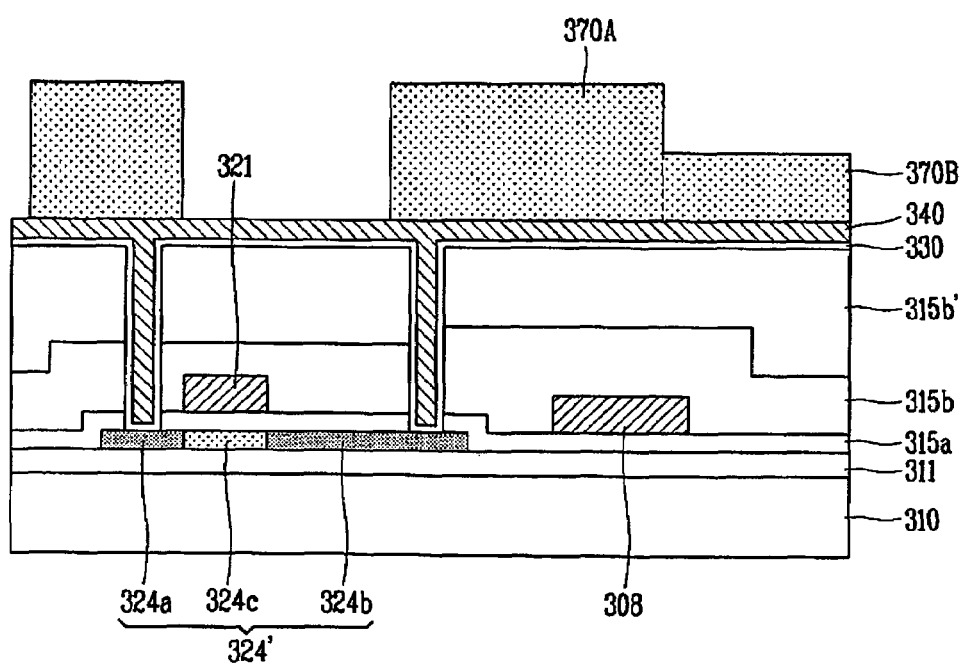

As depicted in FIG. 11B, after the photosensitive film 370 exposed through the diffraction mask 380 is developed, a first photosensitive film pattern 370A and a second photosensitive film pattern 370B are left at a predetermined thickness in the regions corresponding to the intercepting region III and the slit region II, which have wholly or partially intercepted light. The photosensitive film is completely removed in the region corresponding to the transmitting region I, which has transmitted all of the light, thereby exposing the surface of the third conductive film 340.

The first photosensitive film pattern 370A formed in the region corresponding to the intercepting region III is thicker than the second photosensitive film pattern 370B formed in the region corresponding to the slit region II. The photosensitive film is completely removed in the region corresponding to the transmitting region I, which has transmitted the whole light because a positive photoresist has been employed. The present embodiments are not limited to a positive photoresist, for example, a negative photoresist may also be used.

Figure 11C:
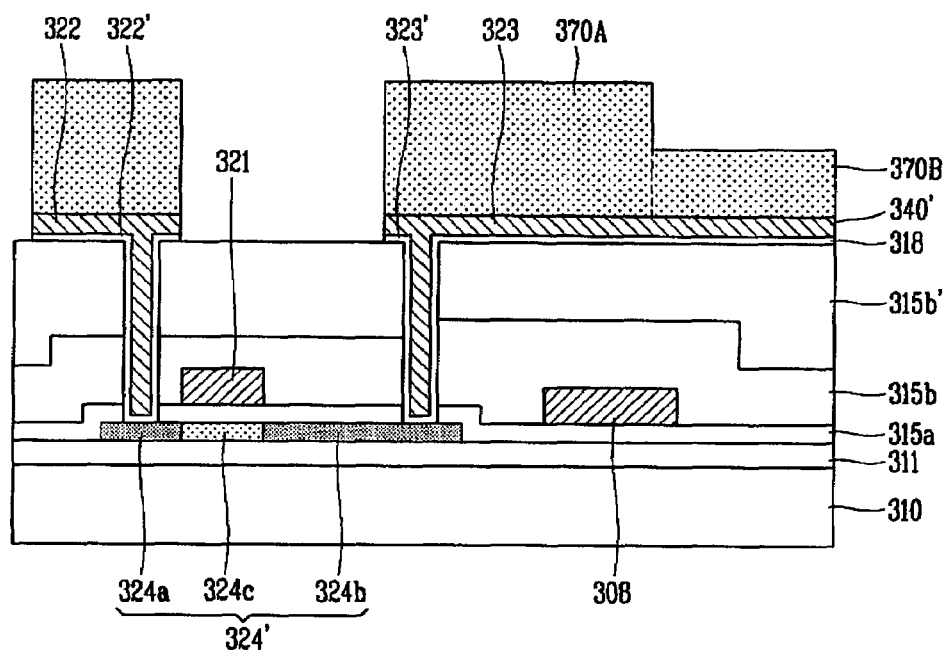

As illustrated in FIG. 11C, after the second conductive film 330 and the third conductive film 340 disposed below are selectively removed by using the first photosensitive film pattern 370A and the second photosensitive film pattern 370B as a mask. A source electrode 322 and a drain electrode 323 made of the third conductive film 340 and electrically connected to the source region 324a and the drain region 324b of the active pattern 324' through the first contact hole 340a and the second contact hole 340b are formed on the substrate 310.

A source electrode pattern 322' and a drain electrode pattern 323' which are made of the third conductive film and which have their sides patterned in the same shapes as those of the source electrode 322 and the drain electrode 323 are formed under the source electrode 322 and the drain electrode 323.

The source electrode pattern 322' and the drain electrode pattern 323' electrically connect the source electrode 322 and the drain electrode 323 disposed above to the source region 324a and the drain region 324b disposed below.

Part of the drain electrode pattern 323' of the pixel unit is extended to the pixel region, for example, for forming the pixel electrode 318. A third conductive film pattern 340' made of the third conductive film is left on the pixel electrode 318.

Figure 11D:
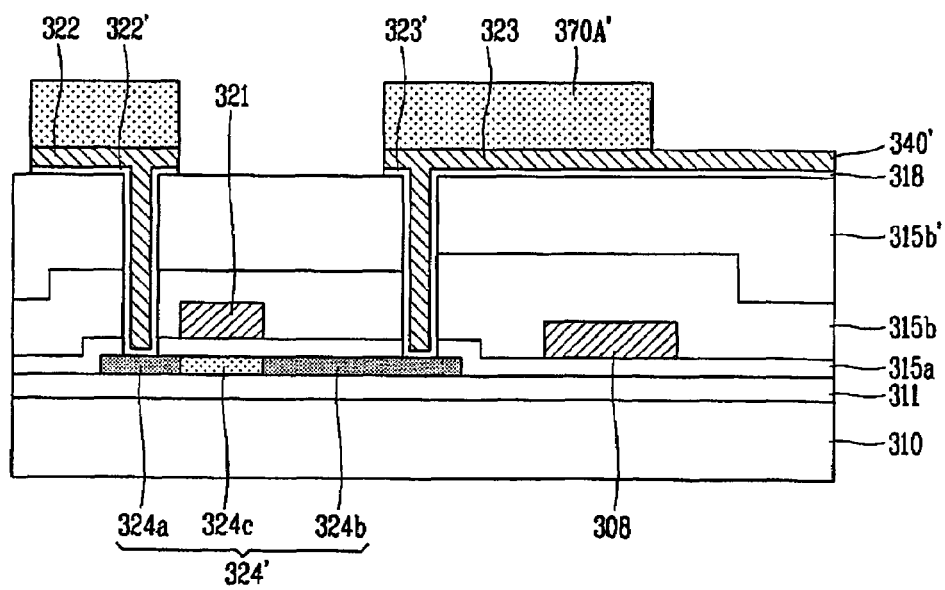

As shown in FIG. 11D, after an ashing process partially removes the first photosensitive film pattern 370A and the second photosensitive film pattern 370B is carried out, the pixel region 318, for example, the second photosensitive film pattern 370B corresponding to the diffraction exposure-applied slit region II is completely removed, which exposes the surface of the third conductive film pattern 340'.

The first photosensitive film pattern 370A is removed as thick as the second photosensitive film pattern 370A, and thus left on the region corresponding to the intercepting region III as a third photosensitive film pattern 370A'.

Figure 11E:
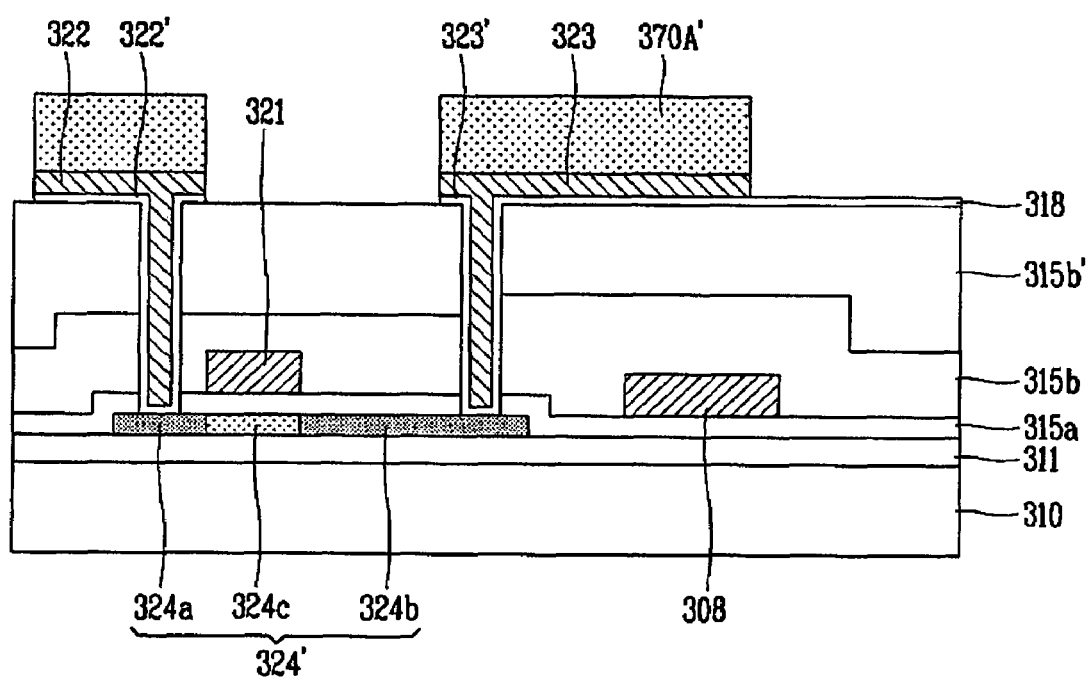

Referring to FIG. 11E, the third conductive film pattern 340' disposed on the pixel electrode 318 is removed using the remaining third photosensitive film pattern 370A' as a mask, thereby exposing the surface of the pixel electrode 318.

Part of the source electrode 322 of the pixel unit is extended to one direction to form the data line 317, and part of the drain electrode 323 of the pixel unit is extended to the pixel region to overlap with the common line 308 disposed below with the second insulating film 315b' therebetween, for example, forming a second storage capacitor.

In accordance with the first to third embodiments, the array substrate is attached to the color filter substrate to face the color filter substrate by the sealants formed at the outer portions of the image display region, for example, forming the LCD device. The array substrate and the color filter substrate are attached to each other through absorption keys formed thereon.

The LCD device and the method of fabricating the same may omit two mask processes by forming the source/drain electrodes and the pixel electrodes by single mask process and removing the contact hole mask process for the pixel electrodes. The number of the masks for forming the TFTs is reduced to simplify the production process and cut down the production cost.

The LCD device and the method of fabricating the same may increase the capacity of the storage capacitors without adding a mask process. As a result, the aperture ratio may be improved due to decrease of the area of the storage capacitors in the pixels.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and the scope of this invention.

What is claimed is:

1. A method of fabricating an LCD device, comprising:
providing a first substrate divided into a pixel unit and a circuit unit;
forming active patterns made of a poly-Si thin film in the pixel unit and the circuit unit and forming storage electrodes made of a conductive material on the active patterns, wherein the active patterns and the storage electrodes are formed by a single mask process;
forming a first insulating film on the first substrate;
forming gate electrodes in the pixel unit and the circuit unit, and forming common lines in the pixel unit;
forming p+ source regions and p+ drain regions in regions of the active patterns;
forming a first interlayer insulating film and a second interlayer insulating film on the first substrate;
forming first contact holes and second contact holes that expose the source regions and the drain regions of the active patterns;
forming a first conductive film and a second conductive film on the whole surface of the first substrate;
forming first photosensitive film patterns having a first thickness in first regions of the first substrate, and second photosensitive film patterns having a second thickness in second regions thereof;
forming source electrodes, drain electrodes and data lines made of the second conductive film in the first regions, and forming pixel electrodes made of the first conductive film and second conductive film patterns made of the second conductive film in the first regions, by selectively removing the first conductive film and the second conductive film by using the first photosensitive film patterns and the second photosensitive film patterns as masks;
forming third photosensitive film patterns having a third thickness by removing the second photosensitive film patterns and partially removing the first photosensitive film patterns;
exposing the pixel electrodes by removing the second conductive film patterns of the second regions by using the third photosensitive film patterns as masks,
wherein the source electrodes and drain electrodes are electrically connected to the source regions and the drain regions of the active patterns through the first contact holes and the second contact holes, respectively, and
wherein the source electrodes, the drain electrodes and the pixel electrodes are formed by a single mask process;
providing a second substrate;
forming a liquid crystal layer at least one of the first or second substrates; and
attaching the first and second substrates.

2. The method as claimed in claim 1, wherein the common lines overlap with the storage electrodes disposed below, with the first insulating film therebetween, for forming first storage capacitors.

3. The method as claimed in claim 1, wherein the common lines overlap with parts of the drain electrodes disposed above, with the second insulating film therebetween, for forming second storage capacitors.

4. The method as claimed in claim 1, wherein the first interlayer insulating film comprises a $SiO_2$ film.

5. The method as claimed in claim 4, which performs an activation process after forming the first interlayer insulating film.

6. The method as claimed in claim 1, wherein the second interlayer insulating film comprises a SiNx film.

7. The method as claimed in claim 1, wherein the second interlayer insulating film comprises at least a double film that includes a SiNx film.

8. The method as claimed in claim 6, further comprising performing a hydrogenation process after forming the second interlayer insulating film.

9. The method as claimed in claim 7, further comprising performing a hydrogenation process after forming the second interlayer insulating film.

10. The method as claimed in claim 1, wherein source electrode patterns, drain electrode patterns and data line patterns which comprise of the first conductive film and which have their sides patterned in the same shapes as those of the source electrodes, the drain electrodes and the data lines are formed under the source electrodes, the drain electrodes and the data lines.

11. The method as claimed in claim 1, wherein the first photosensitive film patterns are removed as thick as the second photosensitive film patterns by an ashing process, and thus patterned to the third photosensitive film patterns having the third thickness.

12. The method as claimed in claim 1, wherein the first regions are the regions in which the source electrodes, the drain electrodes and the data lines are formed.

13. The method as claimed in claim 1, wherein the second regions are the regions in which the pixel electrodes are formed.

14. The method as claimed in claim 1, wherein the first thickness is thicker than the second thickness.

15. The method as claimed in claim 1, wherein the first conductive film is made of a transparent conductive material.

16. The method as claimed in claim 1, wherein the second conductive film is made of an opaque conductive material.

17. An LCD device, comprising:
a first substrate divided into a pixel unit and a circuit unit;
active patterns in the pixel unit and the circuit unit of the first substrate, wherein the active patterns are made of poly-Si thin film;
storage electrodes formed on the active patterns and made of a conductive material, wherein the active patterns and the storage electrodes are formed by a single mask process;
a first insulating film on the first substrate;
gate electrodes in the pixel unit and the circuit unit of the first substrate, and common lines in the pixel unit of the first substrate;
p+ source regions and p+ drain regions in regions of the active patterns;
a first interlayer insulating film and a second interlayer insulating film on the first substrate;
first contact holes and second contact holes in regions of the first insulating film, the first interlayer insulating film and the second interlayer insulating film, that expose the source regions and the drain regions of the active patterns;
source electrodes and drain electrodes that electrically connect to the source regions and the drain regions of the active patterns through the first contact holes and the second contact holes;
pixel electrodes connected to the drain electrodes, wherein the source electrodes, the drain electrodes and the pixel electrodes are formed by a single mask process;
source electrode patterns, drain electrode patterns and data line patterns under the source electrodes, the drain electrodes and the data lines, which comprise of the first conductive film forming the pixel electrodes, and which have their sides patterned in the same shapes as those of the source electrodes, the drain electrodes and the data lines;

a second substrate attached to the first substrate; and a liquid crystal layer formed between the first substrate and the second substrate.

18. The LCD device as claimed in claim 17, wherein the common lines overlap with the storage electrodes disposed below with the first insulating film therebetween, for forming first storage capacitors.

19. The LCD device as claimed in claim 17, wherein the common lines overlap with parts of the drain electrodes disposed above with the second insulating film therebetween, for forming second storage capacitors.

20. The LCD device as claimed in claim 17, wherein the first interlayer insulating film comprises a $SiO_2$ film.

21. The LCD device as claimed in claim 20, which performs an activation process after forming the first interlayer insulating film.

22. The LCD device as claimed in claim 17, wherein the second interlayer insulating film comprises a SiNx film.

23. The LCD device as claimed in claim 17, wherein the second interlayer insulating film comprises at least a double film that includes an SiNx film.

24. The LCD device as claimed in claim 22, wherein a hydrogenation process is performed after the second interlayer insulating film is formed.

25. The LCD device as claimed in claim 23, wherein a hydrogenation process is performed after the second interlayer insulating film is formed.

26. The LCD device as claimed in claim 23, wherein the first conductive film is made of a transparent conductive material.

27. The LCD device as claimed in claim 23, wherein the source electrodes, the drain electrodes and the data lines are made of an opaque conductive material.

28. The LCD device as claimed in claim 23, wherein the source electrodes, the drain electrodes and the data lines are made of Al, Al alloy, W, Cu, Cr or Mo.

29. A method of fabricating an LCD device, comprising:
providing a first substrate;
forming a first insulating layer, a first interlayer insulating film and a second interlayer insulating film on a first substrate;
forming a source region and a drain region of active patterns;
forming first contact holes and second contact holes that expose the source region and the drain region of active patterns by partially removing the first insulating film, the first interlayer insulating film and the second interlayer insulating film;
forming a first conductive film and a second conductive film on the whole surface of the first substrate;
forming first photosensitive film patterns having a first thickness in first regions of the first substrate, and second photosensitive film patterns having a second thickness in second regions thereof;
forming source electrodes, drain electrodes and data lines made of the second conductive film in the first regions, and forming pixel electrodes made of the first conductive film and second conductive film patterns made of the second conductive film in the first regions, by selectively removing the first conductive film and the second conductive film by using the first photosensitive film patterns and the second photosensitive film patterns as masks;
forming third photosensitive film patterns having a third thickness by removing the second photosensitive film patterns and partially removing the first photosensitive film patterns;
exposing the pixel electrodes by removing the second conductive film patterns of the second regions by using the third photosensitive film patterns as masks,
wherein the source electrodes and drain electrodes are electrically connected to the source regions and the drain regions of the active patterns through the first contact holes and the second contact holes, respectively;
providing a second substrate;
forming a liquid crystal layer on any one of the first and second substrates; and
attaching the first and second substrates.

30. The method as claimed in claim 29, wherein the source electrodes, the drain electrodes and the pixel electrodes are formed by a single mask process.

31. The method as claimed in claim 1, wherein the first conductive film comprises ITO or IZO.

32. The method as claimed in claim 1, wherein the second conductive film comprises Al, Al alloy, W, Cu, Cr or Mo.

33. The LCD device as claimed in claim 23, wherein the first conductive film comprises ITO or IZO.

* * * * *

UNITED STATES PATENT AND TRADEMARK OFFICE
CERTIFICATE OF CORRECTION

PATENT NO. : 7,633,573 B2 Page 1 of 1
APPLICATION NO. : 11/586831
DATED : December 15, 2009
INVENTOR(S) : Kim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 525 days.

Signed and Sealed this

Ninth Day of November, 2010

David J. Kappos
*Director of the United States Patent and Trademark Office*